(12) United States Patent
Ham et al.

(10) Patent No.: US 10,560,052 B2
(45) Date of Patent: Feb. 11, 2020

(54) PHOTOVOLTAIC MODULE CAPABLE OF OUTPUTTING AC VOLTAGE WITHOUT CONVERTING LEVEL OF DC VOLTAGE

(71) Applicant: LG ELECTRONICS INC., Seoul (KR)

(72) Inventors: Myungsoo Ham, Seoul (KR); Myonghwan Kim, Seoul (KR); Sangin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 53 days.

(21) Appl. No.: 15/698,369

(22) Filed: Sep. 7, 2017

(65) Prior Publication Data

US 2018/0069504 A1 Mar. 8, 2018

(30) Foreign Application Priority Data

Sep. 8, 2016 (KR) .................. 10-2016-0115734

(51) Int. Cl.
| | |
|---|---|
| *G05F 1/67* | (2006.01) |
| *H02S 40/32* | (2014.01) |
| *H01L 31/044* | (2014.01) |
| *H02S 40/34* | (2014.01) |
| *H02S 40/38* | (2014.01) |

(52) U.S. Cl.
CPC ............ *H02S 40/32* (2014.12); *H01L 31/044* (2014.12); *H02S 40/34* (2014.12); *H02S 40/38* (2014.12); *G05F 1/67* (2013.01)

(58) Field of Classification Search
CPC ........... G05F 1/67; H02S 40/32; H01L 31/044
See application file for complete search history.

(56) References Cited

U.S. PATENT DOCUMENTS

| | | | | |
|---|---|---|---|---|
| 4,379,989 | A  * | 4/1983 | Kurz .................... | H02J 7/0034 320/165 |
| 2012/0325288 | A1 | 12/2012 | Jang et al. | |
| 2013/0051106 | A1* | 2/2013 | Kuo .................... | H02M 7/5387 363/132 |
| 2013/0193775 | A1* | 8/2013 | Lee ....................... | H02M 7/537 307/151 |
| 2014/0119072 | A1* | 5/2014 | Behrends ............. | H02H 1/0015 363/55 |
| 2015/0326177 | A1* | 11/2015 | Koehler ................. | H02S 40/34 136/244 |
| 2016/0294189 | A1* | 10/2016 | Uno ......................... | G05F 1/67 |
| 2018/0054065 | A1* | 2/2018 | Yang ........................ | H02J 3/18 |

FOREIGN PATENT DOCUMENTS

| | | |
|---|---|---|
| JP | 10-289025 A | 10/1998 |
| KR | 10-1187260 B1 | 10/2012 |
| KR | 10-2012-0127955 A | 11/2012 |
| KR | 10-2012-0140418 A | 12/2012 |
| KR | 10-2014-0143476 A | 12/2014 |

* cited by examiner

*Primary Examiner* — Harry R Behm
(74) *Attorney, Agent, or Firm* — Birch, Stewart, Kolasch & Birch, LLP

(57) ABSTRACT

Disclosed is a photovoltaic module. The photovoltaic module includes a solar cell module including a plurality of solar cells, and an inverter unit to receive a direct current (DC) voltage from the solar cell module and convert the DC voltage received from the solar cell module into an alternating current (AC) voltage without converting a level of the DC voltage received from the solar cell module.

14 Claims, 22 Drawing Sheets

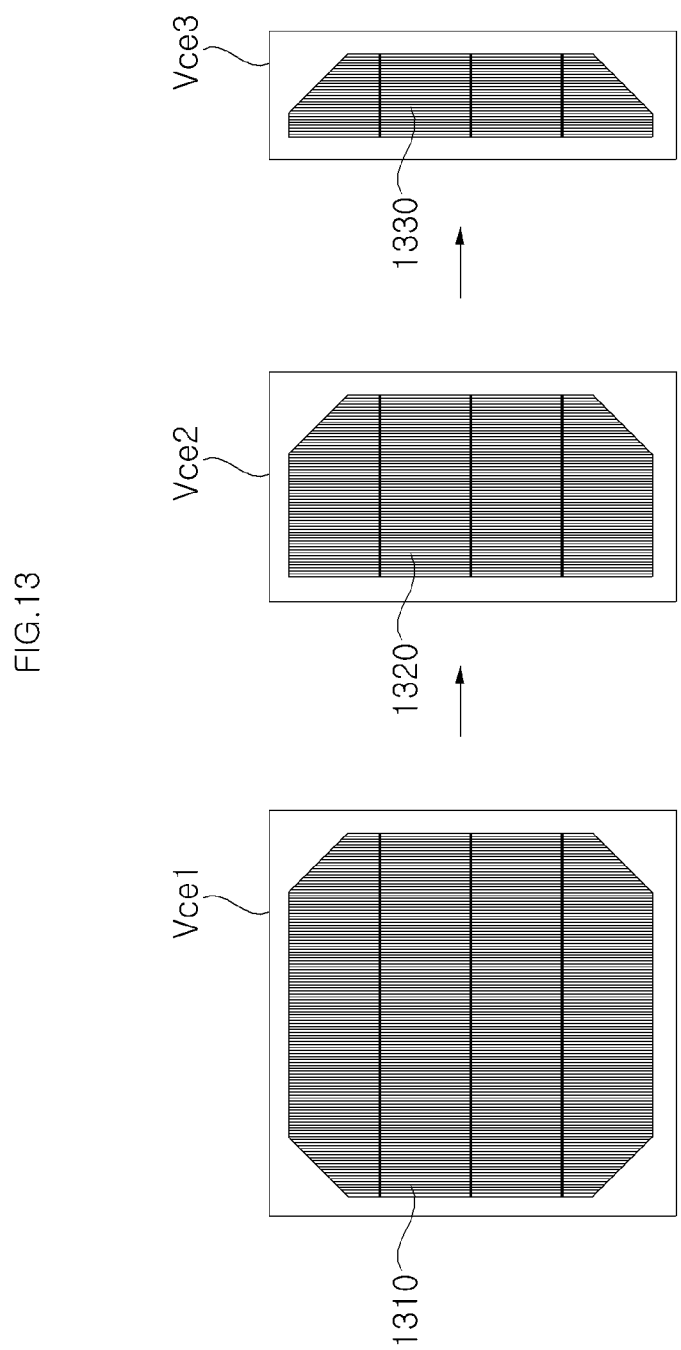

PHOTOVOLTAIC MODULE CAPABLE OF OUTPUTTING AC VOLTAGE WITHOUT CONVERTING LEVEL OF DC VOLTAGE

CROSS-REFERENCE TO RELATED APPLICATION

This application claims the priority benefit of Korean Patent Application No. 10-2016-0115734, filed on Sep. 8, 2016 in the Korean Intellectual Property Office, the disclosure of which is incorporated herein by reference.

BACKGROUND OF THE INVENTION

1. Field of the Invention

The present invention relates to a photovoltaic module and, more particularly, to a photovoltaic module capable of outputting an alternating current (AC) voltage without converting a level of a direct current (SC) voltage from a solar cell module.

2. Description of the Related Art

Recently, as it is expected that existing energy resources such as oil or coal will be exhausted, interest in alternative energy resources to replace the existing energy resources has been increasing. Thereamong, solar cells are in the spotlight as next-generation cells for directly converting sunlight energy into electric energy using semiconductor devices.

In photovoltaic module, solar cells for photovoltaic power generation are connected in series or in parallel.

If the photovoltaic module outputs an AC voltage, a converter for boosting up a DC voltage output from a solar cell module is needed. Then, an inverter needs to convert the boosted DC voltage into an AC voltage.

Herein, various circuit elements such as a transformer and a switching element are needed to configure the converter for boosting. However, loss occurs during voltage conversion due to the circuit elements.

SUMMARY OF THE INVENTION

It is an object of the present invention to provide a photovoltaic module capable of outputting an AC voltage without level conversion of a DC voltage from a solar cell module.

In accordance with an aspect of the present invention, the above and other objects can be accomplished by the provision of a photovoltaic module including a solar cell module including a plurality of solar cells, and an inverter unit to receive a direct current (DC) voltage from the solar cell module and convert the DC voltage received from the solar cell module into an alternating current (AC) voltage without converting a level of the DC voltage received from the solar cell module.

In accordance with another aspect of the present invention, there is provided a photovoltaic module including a solar cell module including a plurality of solar cells, an inverter unit to receive a direct current (DC) voltage output from the solar cell module and convert the DC voltage received from the solar cell module into an alternating current (AC) voltage without changing a level of the DC voltage received from the solar cell module, the inverter unit including a plurality of switching elements, and a controller to control the inverter unit, wherein the controller performs a control operation such that switching frequencies of the switching elements in the inverter unit are higher than a frequency of a grid.

BRIEF DESCRIPTION OF THE DRAWINGS

The above and other objects, features and other advantages of the present invention will be more clearly understood from the following detailed description taken in conjunction with the accompanying drawings, in which:

FIG. 13 is a view illustrating an exemplary solar cell in the photovoltaic module of FIG. 2A.

DETAILED DESCRIPTION OF THE PREFERRED EMBODIMENTS

Reference will now be made in detail to the preferred embodiments of the present invention, examples of which are illustrated in the accompanying drawings.

The suffixes "module" and "unit" in elements used in description below are given only in consideration of ease in preparation of the specification and do not have specific meanings or functions. Therefore, the suffixes "module" and "unit" may be used interchangeably.

Figure 1:
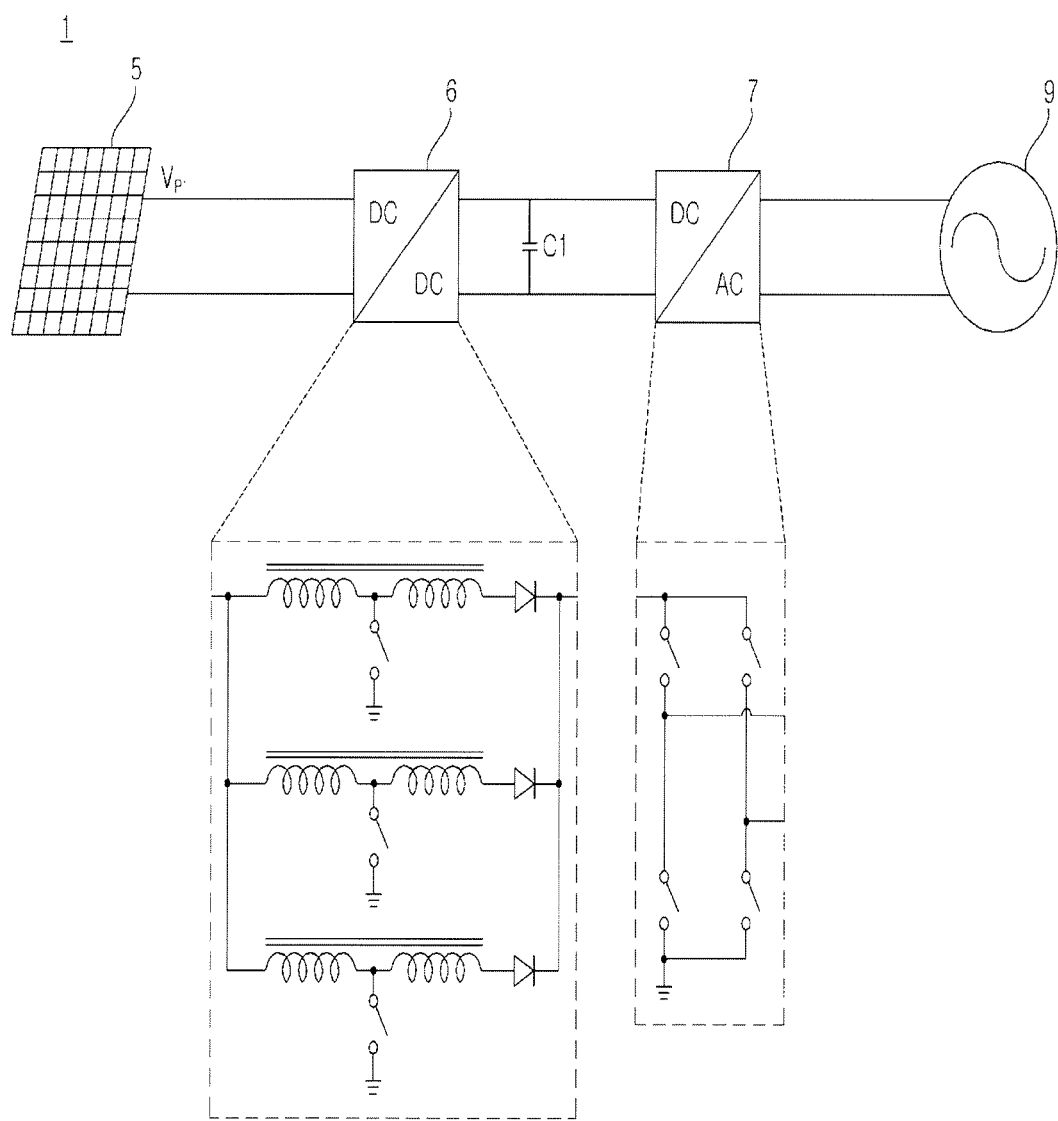
FIG. 1 is a view illustrating a conventional photovoltaic module.

FIG. 1 illustrates a conventional photovoltaic module.

A photovoltaic module 1 may include a solar cell module 5 for outputting a direct current (DC) voltage Vp1, a converter unit 6 for converting a level of the DC voltage Vp1 output from the solar cell module 5, and an inverter unit 7 for converting the level-converted DC voltage output from the converter unit 6 into an alternating current (AC) voltage.

The AC voltage converted by the inverter unit 7 may be supplied to a grid 9.

The solar cell module 5 may include a plurality of solar cells.

Typically, a solar cell may output a DC voltage of approximately 0.5V and the solar cell module 5 including about 60 solar cells outputs a DC voltage of approximately 30V.

Meanwhile, when a root mean square (RMS) voltage level of the grid 9 is approximately 220V, a peak voltage of the grid 9 may be approximately 312V or more.

Then, the converter unit 6 needs to boost the voltage of approximately 30V output from the solar cell module 5 by approximately 10 times or more.

As a result, the converter unit 6 requires various circuit elements such as a transformer, a switching element, etc. for boosting a voltage by 11 times or more. However, during voltage conversion, loss occurs due to the circuit elements.

To solve this problem, the present invention is devised to use a solar cell module for outputting a high DC voltage without an additional boosting operation. Then, the converter unit 6 of FIG. 1 is not needed. According to the present invention, an AC voltage may be output without the need to convert the level of the DC voltage output from the solar cell module. This will now be described with reference to FIG. 2A.

Figure 2A:
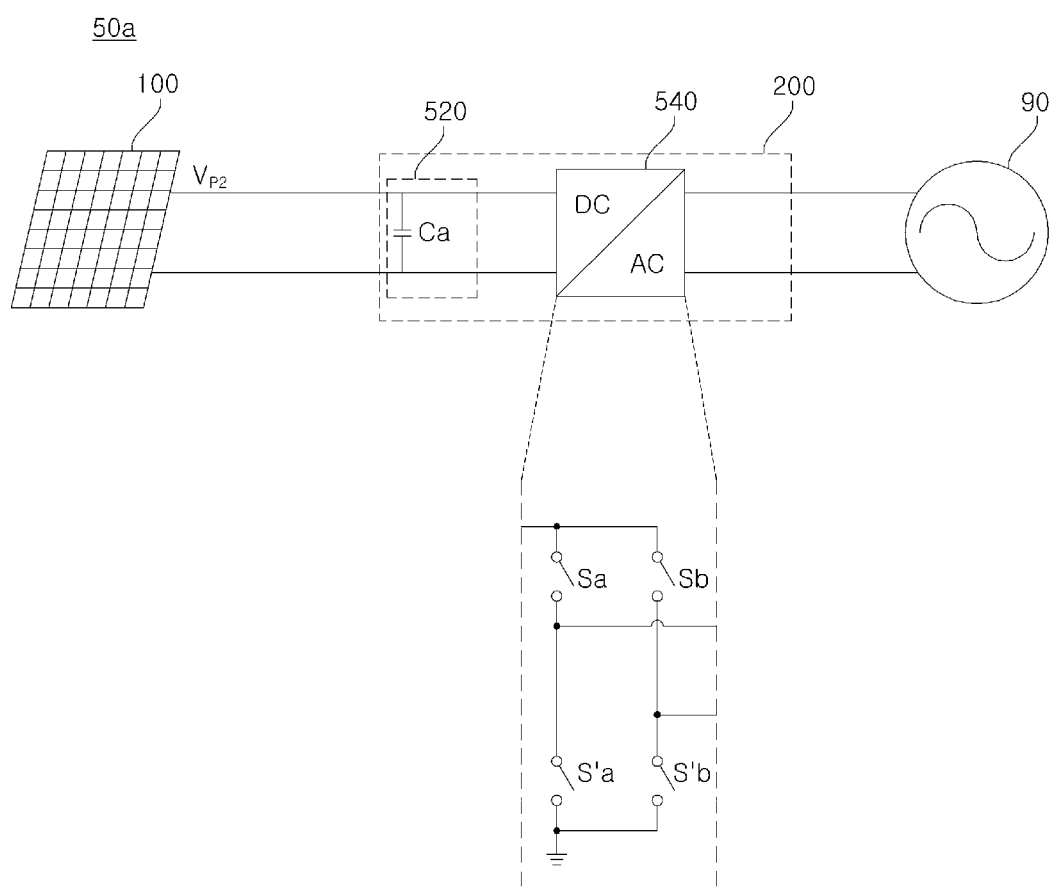
FIG. 2A is a view illustrating a photovoltaic module according to an embodiment of the present invention.

FIG. 2A is a view illustrating a photovoltaic module according to an embodiment of the present invention.

Referring to FIG. 2A, a photovoltaic module 50a according to an embodiment of the present invention includes a solar cell module 100 including a plurality solar cells and an inverter unit 540 for receiving a DC voltage Vp2 from the solar cell module 100 and converting the DC voltage received from the solar cell module 100 into an AC voltage without converting a level of the DC voltage from the solar cell module 100. Thereby, the AC voltage is output without the need to convert the level of the DC voltage from the solar cell module 100.

Accordingly, since the AC voltage may be output without voltage boosting, the photovoltaic module 50a having high efficiency may be provided by reducing loss generated during voltage conversion.

Particularly, a converter for converting a level of the DC voltage, i.e., a DC/DC converter, is omitted and, therefore, circuit implementation is simplified.

Furthermore, since a transformer etc. that should be provided in the converter is omitted, loss generated during voltage conversion and generation of heat are considerably reduced.

Meanwhile, the level of the DC voltage Vp2 output from the solar cell module 100 is desirably greater than a peak value of a voltage of a grid 90. For example, the level of the DC voltage Vp2 from the solar cell module 100 is desirably greater than approximately 312V, in more detail, greater than approximately 400V.

For instance, when 60 solar cells are disposed in the solar cell module 100, it is desirable that each solar cell output a voltage of approximately 6.7V or more. The solar cell module 100 for outputting a high voltage may be achieved by a multi-cutting cell scheme which will be described later with reference to FIG. 13.

As such, the AC voltage may be output through switching by the inverter unit 540 without converting the level of the DC voltage Vp2.

Meanwhile, the photovoltaic module 50a according to an embodiment of the present invention may determine whether the level of the DC voltage Vp2 output from the solar cell module 100 is greater than the peak value of the voltage of the grid 90 and causes the inverter unit 540 to output the AC voltage when the level of the DC voltage Vp2 is greater than the peak voltage of the voltage of the grid 90. Therefore, the AC voltage is stably output.

Meanwhile, the inverter unit 540 may include a first upper arm switching element Sa and a first lower arm switching element S'a, which are connected in series, and a second upper arm switching element Sb and a second lower arm switching element S'b, which are connected in series, wherein the second upper arm switching element Sb and the second lower arm switching element S'b are connected in parallel to the first upper arm switching element Sa and the first lower arm switching element S'a.

Meanwhile, in the photovoltaic module 1 of FIG. 1, a switching frequency of the inverter unit 7 may be approximately 50 or 60 Hz and, instead, a switching frequency of the converter unit 6 may be several hundred Hz or several thousand Hz.

According to the present invention, since the converter unit is omitted, a switching frequency of the first and second upper arm switching elements Sa and Sb and a switching frequency of the first and second lower arm switching elements S'a and S'b in the inverter unit 540 are desirably greater than the frequency of the grid 90.

For example, if the frequency of the grid 90 is approximately 50 or 60 Hz, a switching frequency of the first and second upper arm switching elements Sa and Sb and a switching frequency of the first and second lower arm switching elements S'a and S'b in the inverter unit 540 are desirably several hundred Hz or several thousand Hz, which is greater than the frequency of the grid 90.

Thereby, the inverter unit 540 may output the AC voltage having a frequency of 50 or 60 Hz by fast switching.

Meanwhile, the photovoltaic module 50a of FIG. 2A may further include a capacitor unit 520 for storing the DC voltage output from the solar cell module 100.

Then, the inverter unit 540 may convert the DC voltage stored in the capacitor unit 520 into the AC voltage.

Meanwhile, the capacitor unit 520 and the inverter unit 540 may be arranged in a junction box 200 which is disposed on the back surface of the solar cell module 100.

Figure 2B:
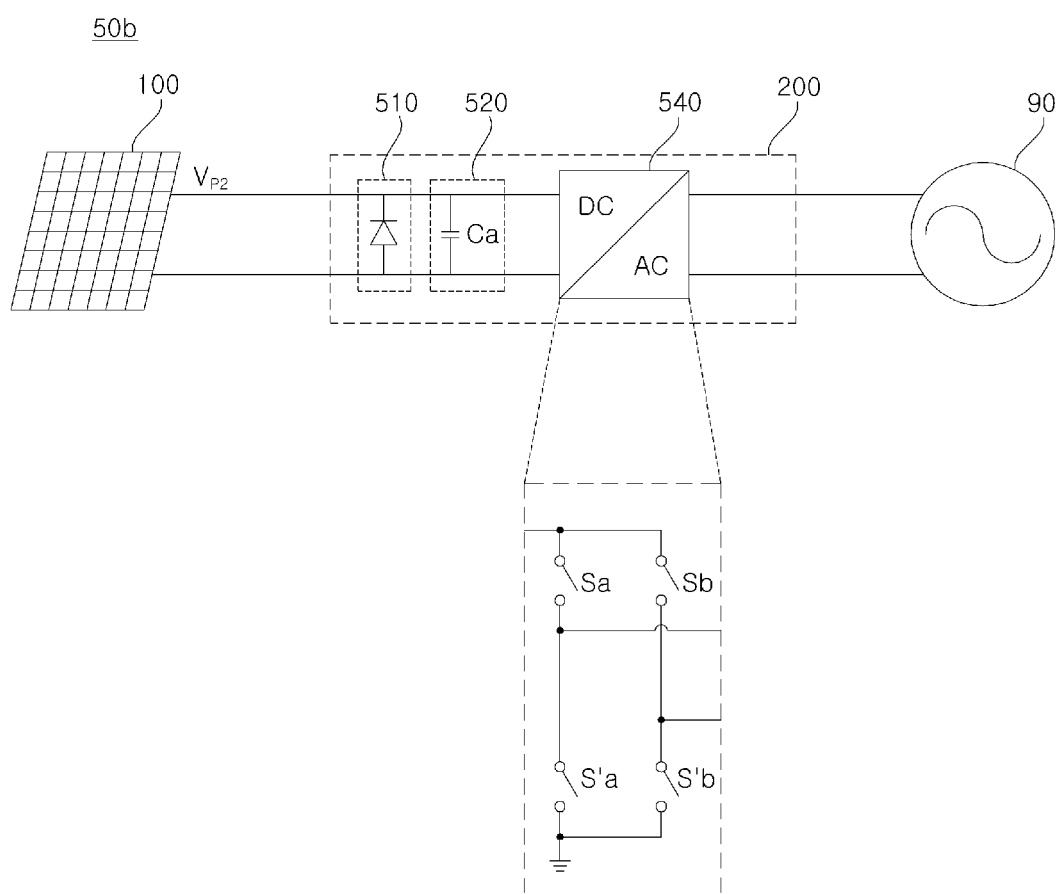
FIG. 2B is a view illustrating a photovoltaic module according to various embodiments of the present invention.

FIG. 2B is a view illustrating a photovoltaic module according to various embodiments of the present invention.

Referring to FIG. 2B, a photovoltaic module 50b may further include a bypass diode unit 510 in addition to the capacitor unit 520 and the inverter unit 540 in the photovoltaic module 50a of FIG. 2A.

That is, the photovoltaic module 50b of FIG. 2B may further include the bypass diode unit 510 for bypassing the DC voltage output from the solar cell module 100.

The capacitor unit 520 may store the DC voltage output from the bypass diode unit 510.

Meanwhile, the bypass diode unit 510, the capacitor unit 520, and the inverter unit 540 may be arranged in the junction box 200 which is disposed on the back surface of the solar cell module 100.

Figure 3A:
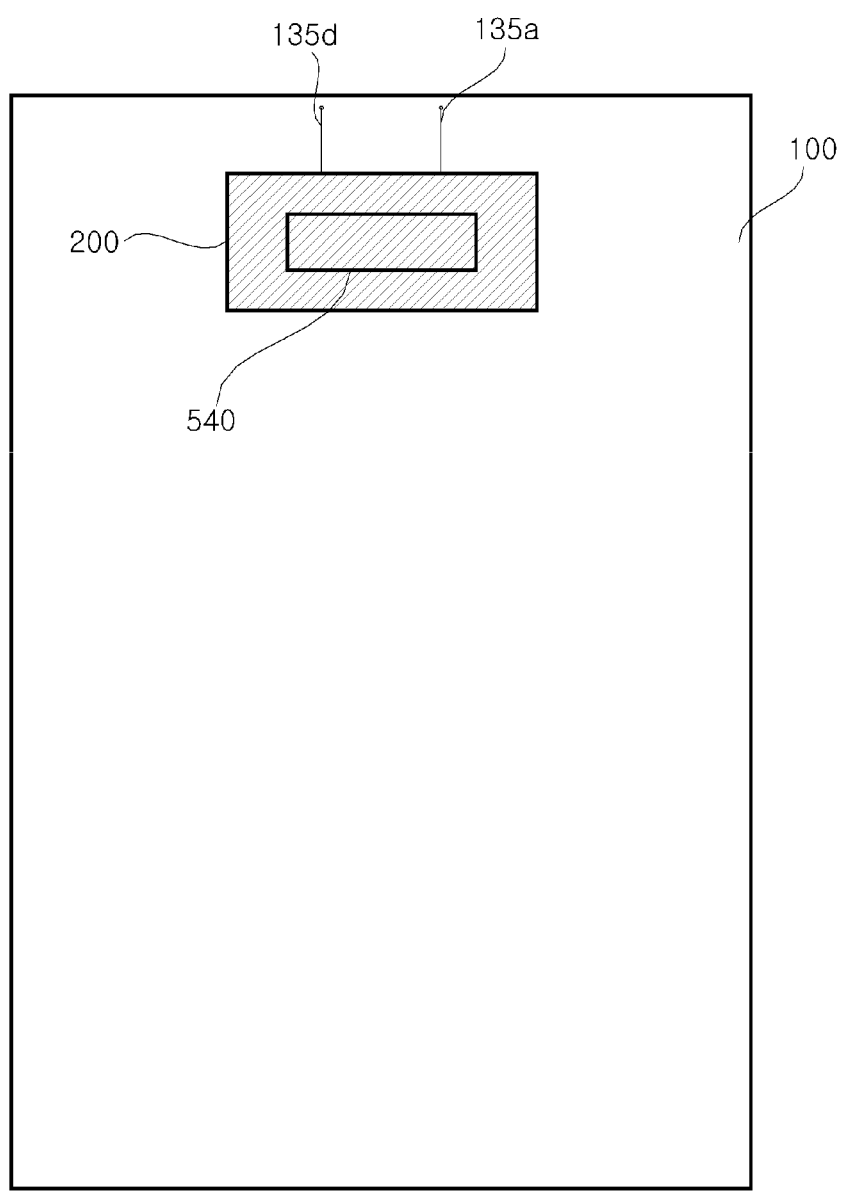
FIG. 3A is a rear view illustrating an exemplary configuration of the photovoltaic module of FIG. 2A or FIG. 2B.

FIG. 3A is a rear view illustrating an exemplary configuration of the photovoltaic module of FIG. 2A or FIG. 2B.

Referring to FIG. 3A, a junction box 200 may be disposed on the back surface of the photovoltaic module 50 or the back surface of the solar cell module 100.

The solar cell module (100 of FIG. 6) may include a plurality of solar cells (SLC1, ..., SLCn of FIG. 6), a first conductive line 135a connected to the first solar cell (SLC1 of FIG. 6) among the solar cells, and a second conductive line 135*d* connected to the second solar cell of (SLCn of FIG. 6) among the solar cells.

Meanwhile, the first conductive line 135*a* may be connected to the first solar cell (SLC1 of FIG. 6) among the solar cells (SLC1, . . . , SLCn of FIG. 6) connected in series and the second conductive line 135*d* may be connected to the last solar cell (SLCn of FIG. 6) among the solar cells (SLC1, . . . , SLCn of FIG. 6) connected in series.

The first conductive line 135*a* and the second conductive line 135*d* may be extended through an opening to the back surface from the front surface of the solar cell module 100 and connected to a circuit element in the junction box.

For example, if the capacitor unit 520 and the inverter unit 540 are disposed in the junction box 200 as illustrated in FIG. 2A, the first conductive line 135*a* and the second conductive line 135*d* may be connected to both terminals of the capacitor unit 520.

As another example, if the bypass diode unit 510, the capacitor unit 520, and the inverter unit 540 are disposed in the junction box 200 as illustrated in FIG. 2B, the first conductive line 135*a* and the second conductive line 135*d* may be connected to both terminals of the bypass diode unit 510.

Figure 3B:
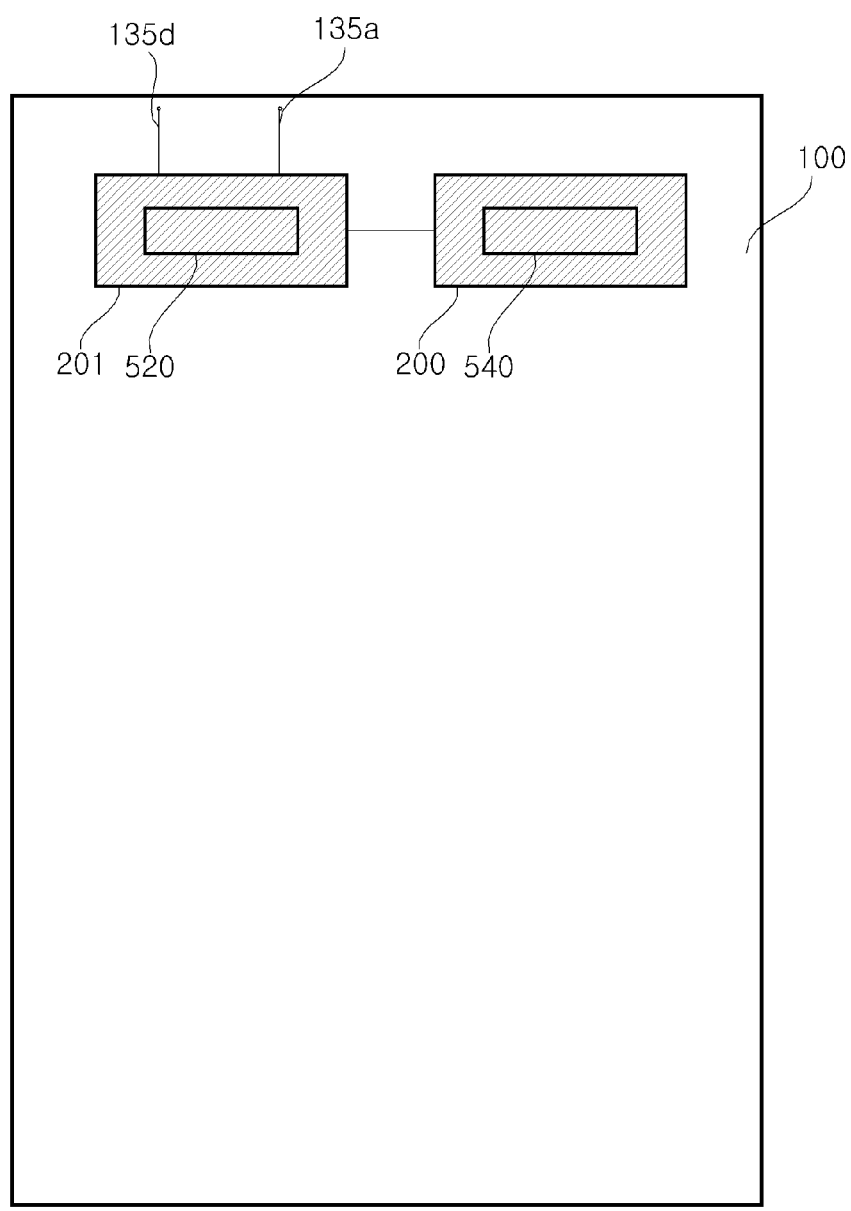
FIG. 3B is a rear view illustrating another exemplary configuration of the photovoltaic module of FIG. 2A or FIG. 2B.

FIG. 3B is a rear view illustrating another exemplary configuration of the photovoltaic module of FIG. 2A or FIG. 2B Referring to FIG. 3B, a second junction box 201 is further disposed on the back surface of the photovoltaic module 50 or the back surface of the solar cell module 100, as compared with FIG. 3A. In this case, the second junction box 201 and the junction box 200 are desirably separated from each other.

As illustrated in FIG. 3B, if the capacitor unit 520 is disposed in the second junction box 201 and the inverter unit 540 is disposed in the junction box 200, the first conductive line 135*a* and the second conductive line 135*d* may be connected to both terminals of the capacitor unit 520.

Meanwhile, unlike FIG. 3B, the bypass diode unit 510 may be disposed in the second junction box 201 and the capacitor unit 520 and the inverter unit 540 may be disposed in the junction box 200.

In this case, the first conductive line 135*a* and the second conductive line 135*d* may be connected to both terminals of the capacitor unit 520.

Figure 4A:
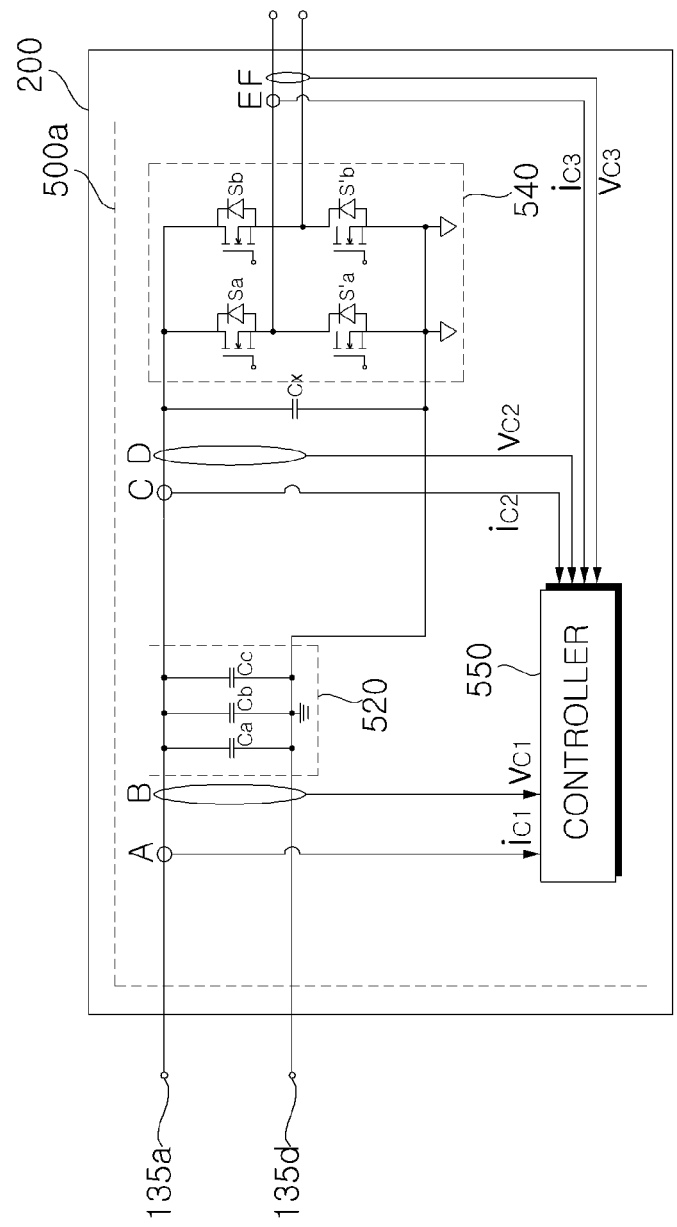
FIGS. 4A and 4B are circuit diagrams illustrating internal configurations of a junction box illustrated in FIG. 3A.
Figure 4B:
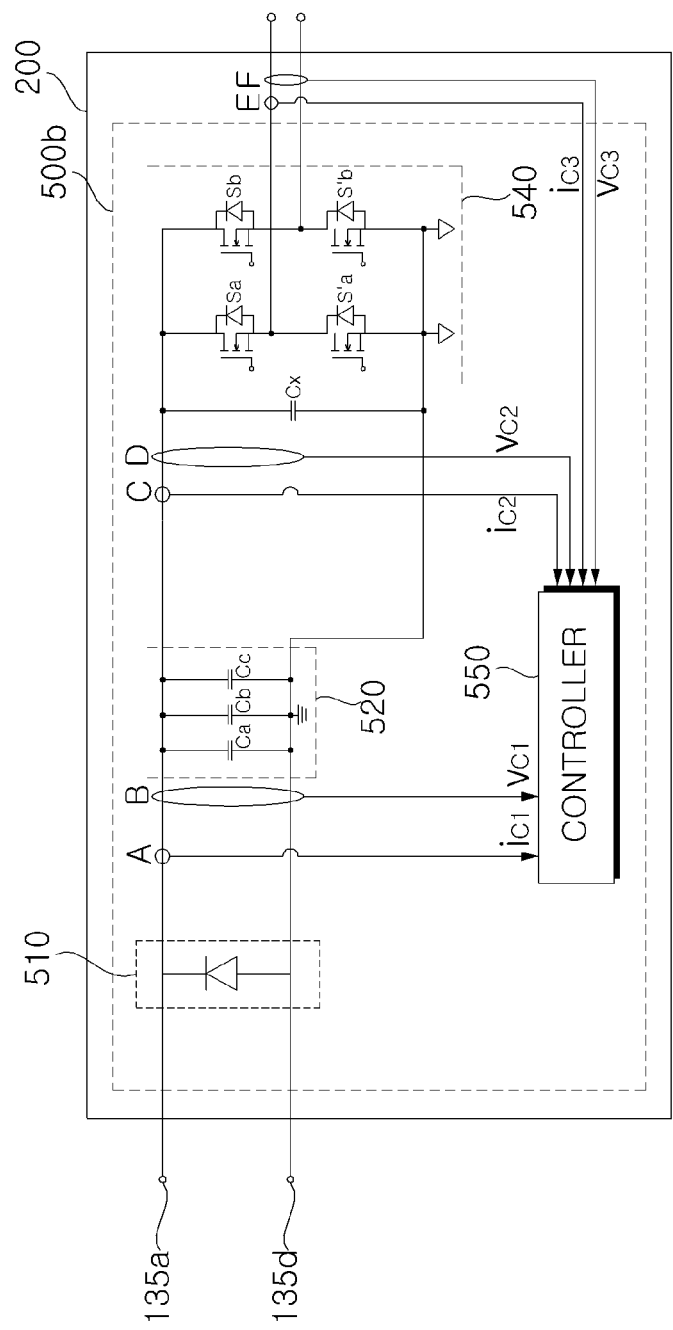

FIGS. 4A and 4B are circuit diagrams illustrating internal configurations of the junction box illustrated in FIG. 3A.

Referring to FIG. 4A, the junction box 200 may include the capacitor unit 520 and the inverter unit 540.

Meanwhile, the junction box 200 of FIG. 4A may further include a capacitor Cx, an input current sensor A, an input voltage sensor B, an inverter input current detector C, an inverter input voltage detector D, an inverter output current detector E, and an inverter output voltage detector F.

Characteristically, the junction box 200 does not include a converter unit and a bypass diode unit.

The capacitor unit 520 may store a DC voltage from the solar cell module 100.

Specifically, the first conductive line 135*a* and the second conductive line 135*d* may be connected to both terminals of the capacitor unit 520, as described above.

Although, in FIG. 4A, the capacitor unit 520 includes a plurality of capacitors Ca, Cb, and Cc connected in parallel, the plural capacitors may be connected in series and in parallel or may be connected in series to a ground terminal. Alternatively, the capacitor unit 520 may include only one capacitor.

The inverter unit 540 may convert the DC voltage stored in the capacitor unit 520 into an AC voltage.

In FIG. 4A, a full-bridge inverter is illustrated as the inverter unit 540. That is, an upper arm switching element Sa and a lower arm switching element S'a connected in series are paired and an upper arm switching element Sb and a lower arm switching element S'b are paired. Thus, two pairs of upper and lower arm switching elements Sa&S'a and Sb&S'b are connected in parallel. A diode may be connected in anti-parallel to each of the switching elements Sa, S'a, Sb, and S'b.

Each of the switching elements Sa, S'a, Sb, and S'b in the inverter unit 540 may perform a turn-on/off operation based on an inverter switching control signal output from a controller 550. Thereby, an AC voltage having a predetermined frequency may be output.

Particularly, the inverter unit 540 may output an AC voltage having the same frequency (approximately 60 Hz or 50 Hz) as an AC frequency of a grid.

The capacitor Cx may be disposed between the capacitor unit 520 and the inverter unit 540.

Meanwhile, both terminals of the capacitor Cx may be referred to as a DC terminal and, therefore, the capacitor Cx may be referred to as a DC terminal capacitor.

The input current sensor A may sense an input current ic1 supplied from the solar cell module 100 to the capacitor unit 520.

The input voltage sensor B may sense an input voltage Vc1 supplied from the solar cell module 100 to the capacitor unit 520. In this case, the input voltage Vc1 may be the same as a voltage stored in the both terminals of the capacitor unit 520.

The sensed input current ic1 and input voltage Vc1 may be input to the controller 550.

The inverter input current detector C may sense a current ic2 input to the inverter unit 540, i.e., a DC terminal current, and the inverter input voltage detector D may sense a voltage Vc2 input to the inverter unit 540, i.e., a DC terminal voltage. The sensed output current ic2 and output voltage Vc2 may be input to the controller 550.

The inverter output current detector E may sense a current ic3 output from the inverter unit 540 and the inverter output voltage detector F may sense a voltage Vc3 output from the inverter unit 540. The detected current ic3 and voltage Vc3 are input to the controller 550.

The controller 550 may output the inverter control signal for controlling each of the switching elements Sa, S'a, Sb, and S'b of the inverter unit 540. Particularly, the controller 550 may output a turn-on timing signal of each of the switching elements Sa, S'a, Sb, and S'b of the inverter unit 540, based on at least one of the detected input current ic1, input voltage Vc1, output current ic2, output voltage Vc2, output current ic3, and output voltage Vc3.

The controller 550 may control the inverter unit 540 to output an AC voltage when a level of a DC voltage output from the solar cell module 100 is greater than a peak value of a voltage of the grid.

The controller 550 may perform a control operation such that a switching frequency of each of the first and second upper arm switching elements Sa and Sb and the first and second lower arm switching elements S'a and S'b in the inverter unit 540 is higher than a frequency of the grid.

As such, although the converter unit is omitted, the AC voltage corresponding to the frequency of the grid may be output through the inverter unit 540.

The controller 550 may calculate a power with respect to each DC voltage from the solar cell module 100 and control the inverter unit 540 to perform conversion into an AC voltage using a DC voltage, output from the solar cell module 100, corresponding to a maximum power among calculated powers.

That is, the controller 550 may calculate a maximum power for the solar cell module 100 and control the inverter unit 540 to output an AC voltage using a DC voltage corresponding to the maximum power.

Therefore, although the converter unit is omitted, power tracking control, particularly, maximum power tracking control, may be performed through the inverter unit 540.

According to an embodiment of the present invention, the controller 550 may determine whether a part of the plural solar cells is shaded, based on the input current ic1 detected by the input current detector A or the input voltage Vc1 detected by the input voltage detector B. If a part of the solar cells is shaded, the controller 550 may perform control to supply a second current Impp2 having a level lower than a first current Impp1 which has been supplied prior to occurrence of a shaded region. Accordingly, even when a bypass diode is not provided, a probability of generating hot spots upon occurrence of a partial shade region may be reduced.

The controller 550 may perform, upon occurrence of the shaded region, a control operation such that the second current Impp2 having a level lower than the first current Impp1 which has flowed into a solar cell prior to occurrence of the shaded region may flow into the solar cell or the solar cell module 100.

The controller 550 may perform a control operation so as not to generate hot spots in the solar cell module 100. That is, as described above, if the shaded region occurs, the controller 550 may perform a control operation so as to supply the second current Impp2 having a level lower than the first current Impp1 which has been supplied prior to occurrence of the shaded region.

Meanwhile, the controller 550 may determine that the shaded region has occurred when a voltage variation rate of the input voltage Vc1 detected by the input voltage detector B is greater than a predetermined value and perform a control operation such that the second current Impp2 having a level lower than the first current Impp1 is supplied so as not to generate hot spots in the solar cell module 100.

If the shaded region occurs in the solar cell module 100, the controller 550 may calculate maximum power points with respect to durations of DC voltages supplied by the solar cell module 100 which is shaded, determine that a maximum value among the calculated maximum power points is a maximum power point, and perform a control operation such that a second voltage Vmpp2 corresponding to the maximum power point is supplied.

If the solar cell module 100 is shaded, the controller 550 may calculate an inflection point of a voltage-power curve in a duration of DC voltages which can be supplied by the solar cell module 100 in which the shaded region occurs and select the calculated inflection point as a maximum power point mpp2. The controller 550 may control the solar cell module 100 to supply the second voltage Vmpp2 corresponding to the maximum power point mpp2.

The junction box 200 of FIG. 4B is similar to the junction box 200 of FIG. 4A.

However, the junction box 200 of FIG. 4B may further include a bypass diode unit 510 in addition to the capacitor unit 520 and the inverter unit 540.

Meanwhile, the junction box 200 of FIG. 4B does not include a converter unit.

As described above, the first conductive line 135a and the second conductive line 135d may be connected to both terminals of the bypass diode unit 510.

Figure 4C:
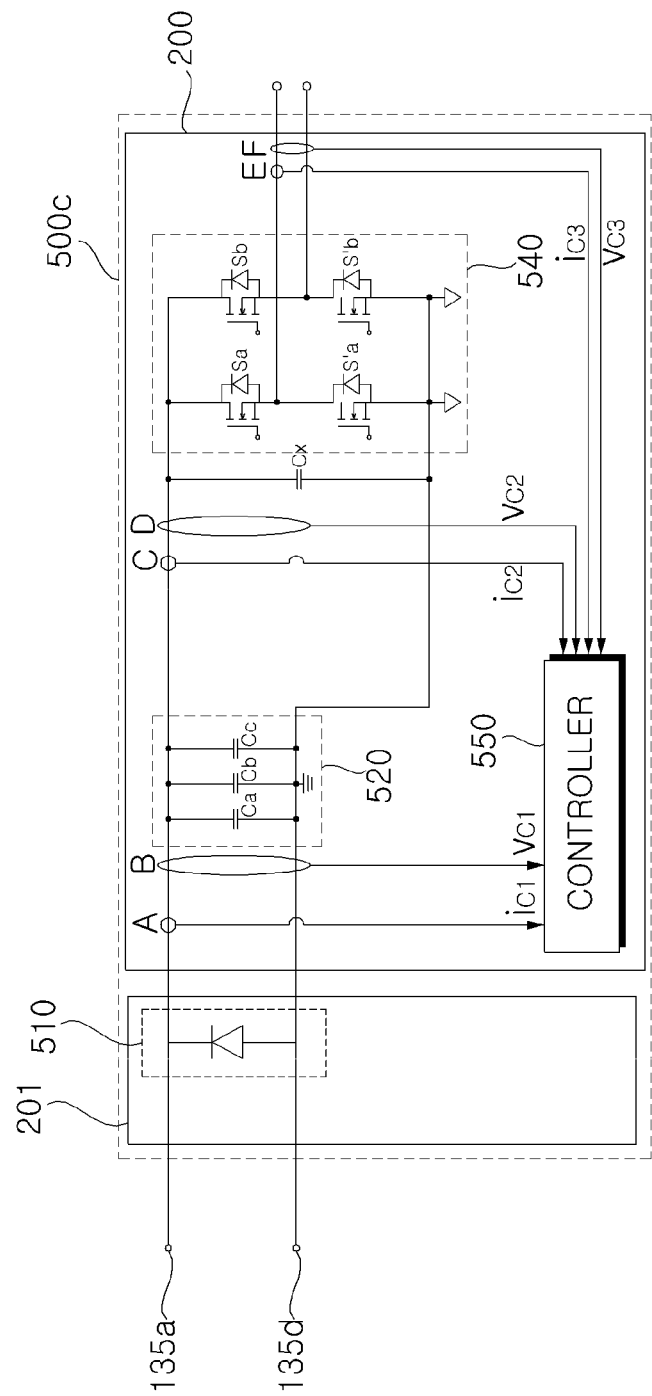
FIG. 4C is a circuit diagram illustrating an internal configuration of a junction box and a second junction box illustrated in FIG. 3B.

FIG. 4C is a circuit diagram illustrating an inner configuration of the junction box 200 and the second junction box 201 shown in FIG. 3B.

Referring to FIG. 4C, the second junction box 201 may include the bypass diode unit 510, and the junction box 200 may include the capacitor unit 520 and the inverter unit 540 as in FIG. 4A or FIG. 4B.

Referring to FIG. 4C, the second junction box 201 separated from the junction box 200 may be disposed on the back surface of the solar cell module and may include the bypass diode unit 510.

The first conductive line 135a and the second conductive line 135d may be connected to both terminals of the bypass diode unit 510 as described above.

Figure 5:
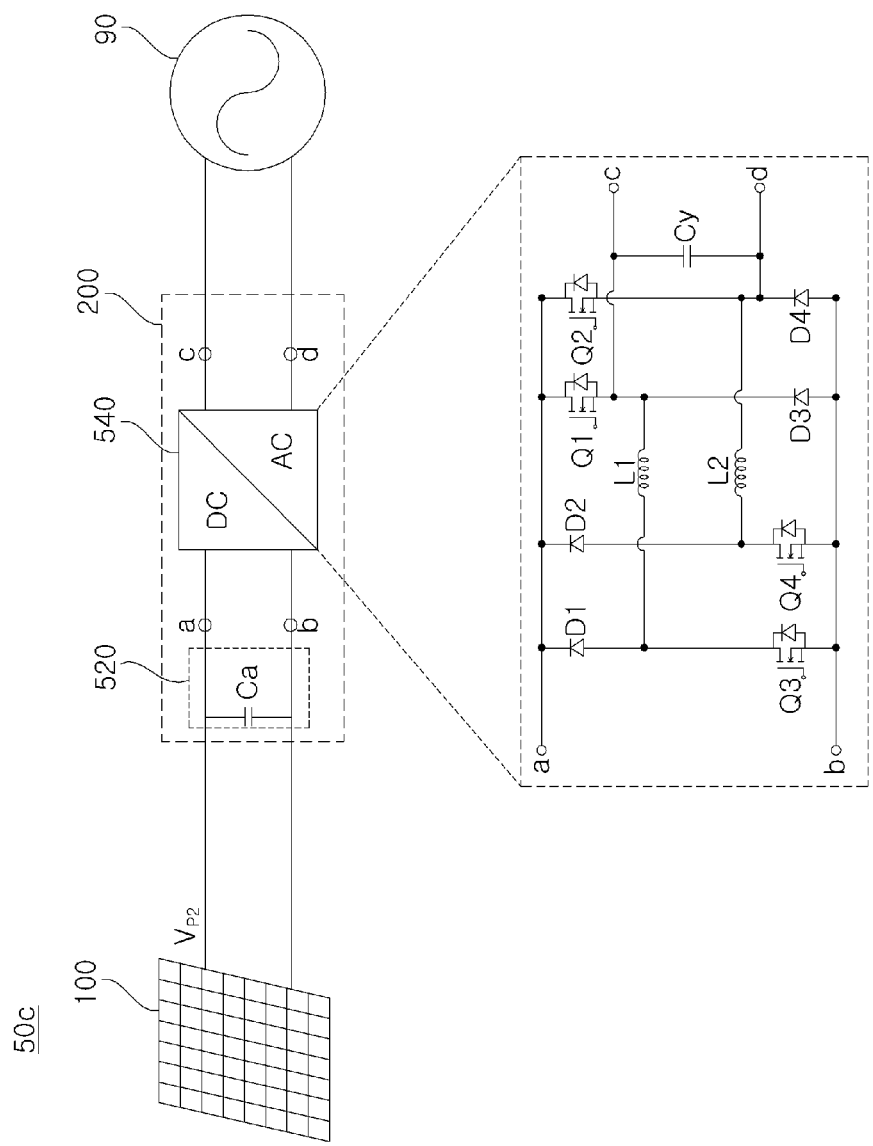
FIG. 5 is a view illustrating a photovoltaic module according to various embodiments of the present invention.

FIG. 5 is a view illustrating a photovoltaic module according to various embodiments of the present invention.

Referring to FIG. 5, a photovoltaic module 50c may include a capacitor unit 520 and an inverter unit 540, wherein a converter unit is omitted similarly to photovoltaic module 50a of FIG. 2A.

However, the internal circuit of the inverter unit 540 of FIG. 2A is different from that of the inverter unit 540 in the photovoltaic module 50c of FIG. 5.

The inverter unit 540 in the photovoltaic module 50c of FIG. 5 may include first to fourth diode elements D1 to D4, first to fourth switching elements Q1 to Q4, and first and second inductor elements L1 and L2.

Between a node a and a node b which are input terminals, the first diode element D1 and third switching element Q3, which are connected in series, are paired, the second diode element D2 and the fourth switching element Q4, which are connected in series, are paired, the first switching element Q1 and the third diode element D3, which are connected in series, are paired, and the second switching element Q2 and the fourth diode element D4, which are connected in series, are paired.

The first inductor L1 is disposed between a node between first diode element D1 and the third switching element Q3 and a node between the first switching element Q1 and the third diode element D3.

The second inductor L2 is disposed between a node between the second diode element D2 and the fourth switching element Q4 and a node between the second switching element Q2 and the fourth diode element D4.

That is, the first diode element D1, the second diode element D2, the first switching element Q1, and the second switching element Q2 are connected in parallel between the node a and node b which are the input terminals. The third switching element Q3, the fourth switching element Q4, the third diode element D3, and the fourth diode element D4 are connected in series to the first diode element D1, the second diode element D2, the first switching element Q1, and the second switching element Q2, respectively.

The first inductor L1 is disposed between the node between the first diode element D1 and the third switching element Q3 and the node between the first switching element Q1 and the third diode element D3.

The second inductor L2 is disposed between the node between the second diode element D2 and the fourth switching element Q4 and the node between the second switching element Q2 and the fourth diode element D4.

The controller 550 may control each of the switching elements Q1 to Q4 of FIG. 5 to perform a switching operation. Particularly, the controller 550 may control each of the switching elements Q1 to Q4 to have a switching frequency of several hundred Hz or several thousand Hz which is higher than a frequency of a grid. Then, an AC voltage may be output through the inverter unit 540 without a converter unit.

Figure 6:
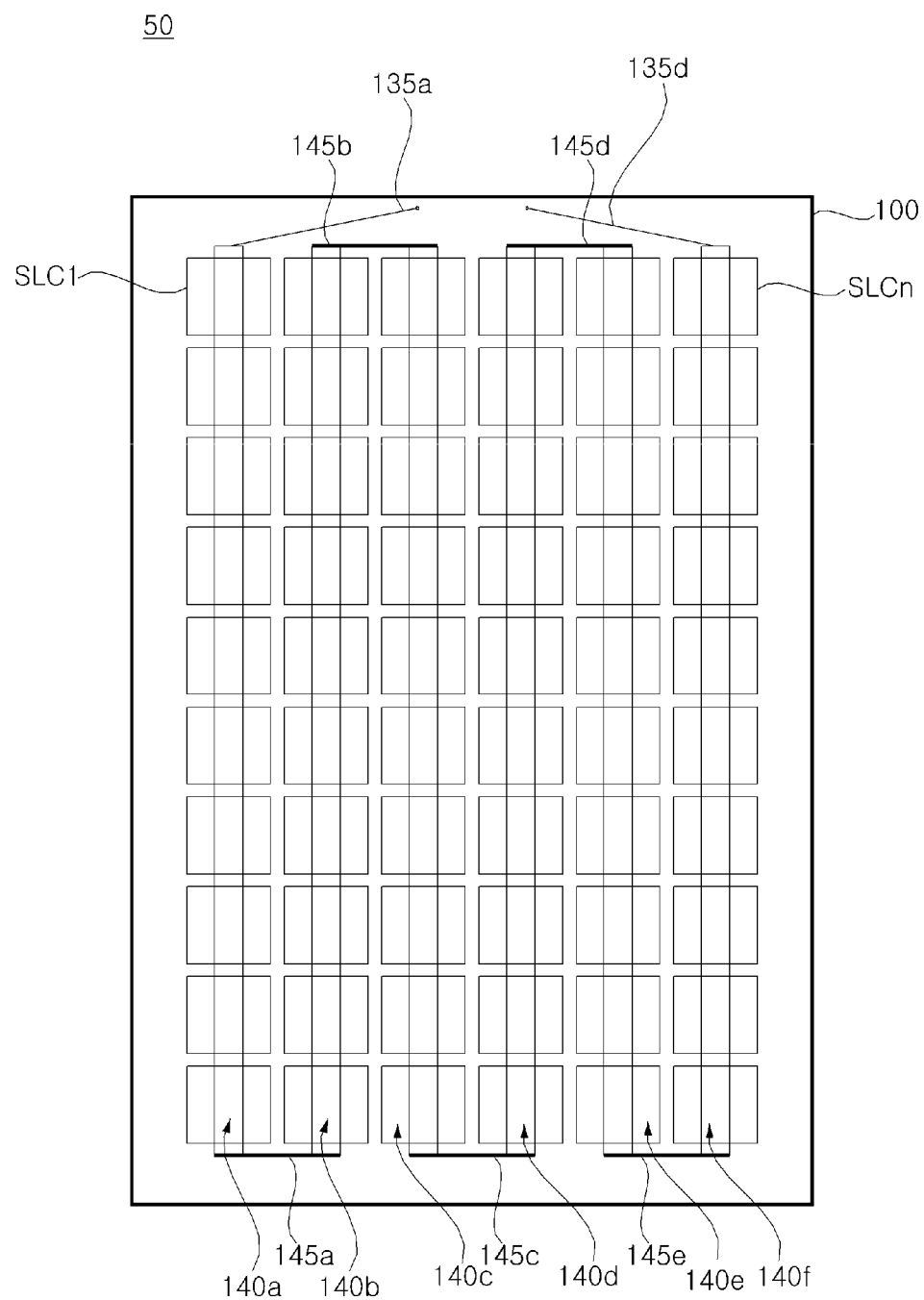
FIG. 6 is a front view of a photovoltaic module according to an embodiment of the present invention.
Figure 7:
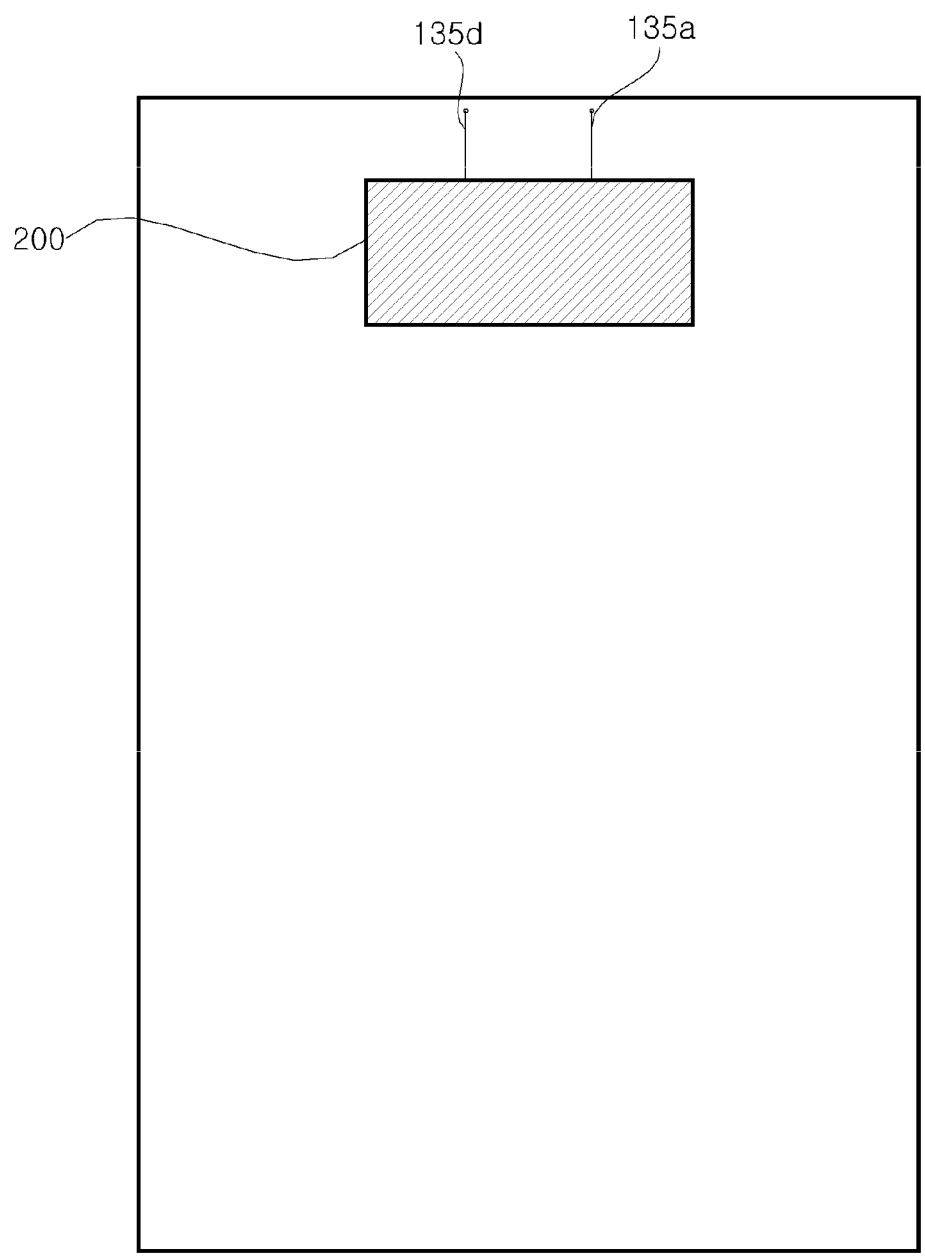
FIG. 7 is a rear view of the photovoltaic module of FIG. 6.

FIG. 6 is a front view of a photovoltaic module according to an embodiment of the present invention. FIG. 7 is a rear view of the photovoltaic module of FIG. 6.

Referring to FIGS. 6 and 7, the photovoltaic module 50 according to an embodiment of the present invention may include the solar cell module 100 and the junction box 200 disposed on the back surface of the solar cell module 100.

The inverter (540 of FIGS. 2A, 2B, and 5) for converting a DC voltage supplied by the solar cell module 100 into an AC voltage may be provided in the junction box 200.

The solar cell module 100 may include a plurality of solar cells SLC1, . . . , SLCn, a first conductive line 135*a* connected to the first solar cell SLC1 among the solar cells, and a second conductive line 135*d* connected to the second solar cell SLCn among the solar cells.

The solar cells SLC1, . . . , SLCn may be connected in series or may be connected in series and in parallel. FIG. 6 illustrates 60 solar cells connected in series.

Meanwhile, the first conductive line 135*a* may be connected to the first solar cell SLC1 and the second conductive line 135*d* may be connected to the last solar cell SLCn among the solar cells SLC1, . . . , SLCn connected in series.

The first conductive line 135*a* and the second conductive line 135*d* may be extended through an opening from the front surface to the back surface of the solar cell module 100.

The first conductive line 135*a* and the second conductive line 135*d*, extended to the back surface of the solar cell module 100, may be connected to the capacitor unit 520 as illustrated in FIGS. 2A and 5. Alternatively, the first conductive line 135*a* and the second conductive line 135*d*, extended to the back surface of the solar cell module 100, may be connected to the bypass diode unit 510 as illustrated in FIG. 2B.

The first conductive line 135*a* and the second conductive line 135*d*, extended to the back surface of the solar cell module 100, may be directly connected to the inverter unit 540 when the capacitor unit 520 and the bypass diode unit 510 in the junction box 200 are omitted.

In this structure, since a converter unit is not provided in the junction box 200, manufacturing costs can be reduced.

If the photovoltaic module 50*b* includes the bypass diode unit 510 as illustrated in FIG. 2B, even though a part of the plural solar cells is shaded, hot spots are not generated by turning on a bypass diode 510.

If a part of the plural solar cells is shaded in a state in which the photovoltaic module 50*a* does not include the bypass diode unit as illustrated in FIG. 2A, hot spots may be generated.

To solve this problem, according to the present invention, the controller 550 performs a control operation such that a second current having a level lower than a first current which has been supplied prior to occurrence of the shaded region is supplied when a part of the plural solar cells is shaded.

That is, upon sensing that the shaded region has occurred, the controller 550 performs a control operation such that the second current having a level lower than the first current which has been supplied prior to occurrence of the shaded region is supplied, thereby reducing a probability of generating a hot spot which is a phenomenon in which temperature increases around a shaded region. Accordingly, the photovoltaic module 50 can be stably driven.

This scheme will be described later with reference to FIG. 11.

Meanwhile, FIG. 6 illustrates a total of 6 strings 140*a*, 140*b*, 140*c*, 140*d*, 140*e*, and 140*f* formed on the front surface of the solar cell module 100, each string including 10 solar cells.

To allow all of the solar cells SLC1, . . . , SLCn to be serially connected, a bus ribbon may be connected between strings.

Referring to FIG. 6, a first bus ribbon 145*a* connected between the first string 140*a* and the second string 140*b*, a third bus ribbon 145*c* connected between the third string 140*c* and the fourth string 140*d*, and a fifth bus ribbon 145*e* connected between the fifth string 140*e* and the sixth string 140*f* are disposed at the lower end of the solar cell module 100.

In addition, a second bus ribbon 145*b* connected between the second string 140*b* and the third string 140*c* and a fourth bus ribbon 145*c* connected between the fourth string 140*d* and the fifth string 140*e* are disposed at the upper end of the solar cell module 100.

That is, the bus ribbons 145*a* to 145*f* may be connected to the upper ends and lower ends of the first string to the sixth strings 140*a* to 140*f* except for the upper part of the first string 140*a* and the upper end of the sixth string 140*f* among the first string to the sixth strings 140*a* to 140*f*.

Meanwhile, the first conductive line 135*a* and the second conductive line 135*d* are respectively connected to the upper end of the first string 140*a* and the upper end of the sixth string 140*f*, which are ends of the solar cell strings to which the bus ribbons 145*a* to 145*f* are not connected. The first conductive line 135*a* and the second conductive line 135*d* may be extended to the back surface of the solar cell module 100 through an opening formed on the solar cell module 100 and may be connected to a circuit element (capacitor unit 520 or bypass diode unit 510) in the junction box 200 disposed on the back surface of the solar cell module 100.

Figure 8:
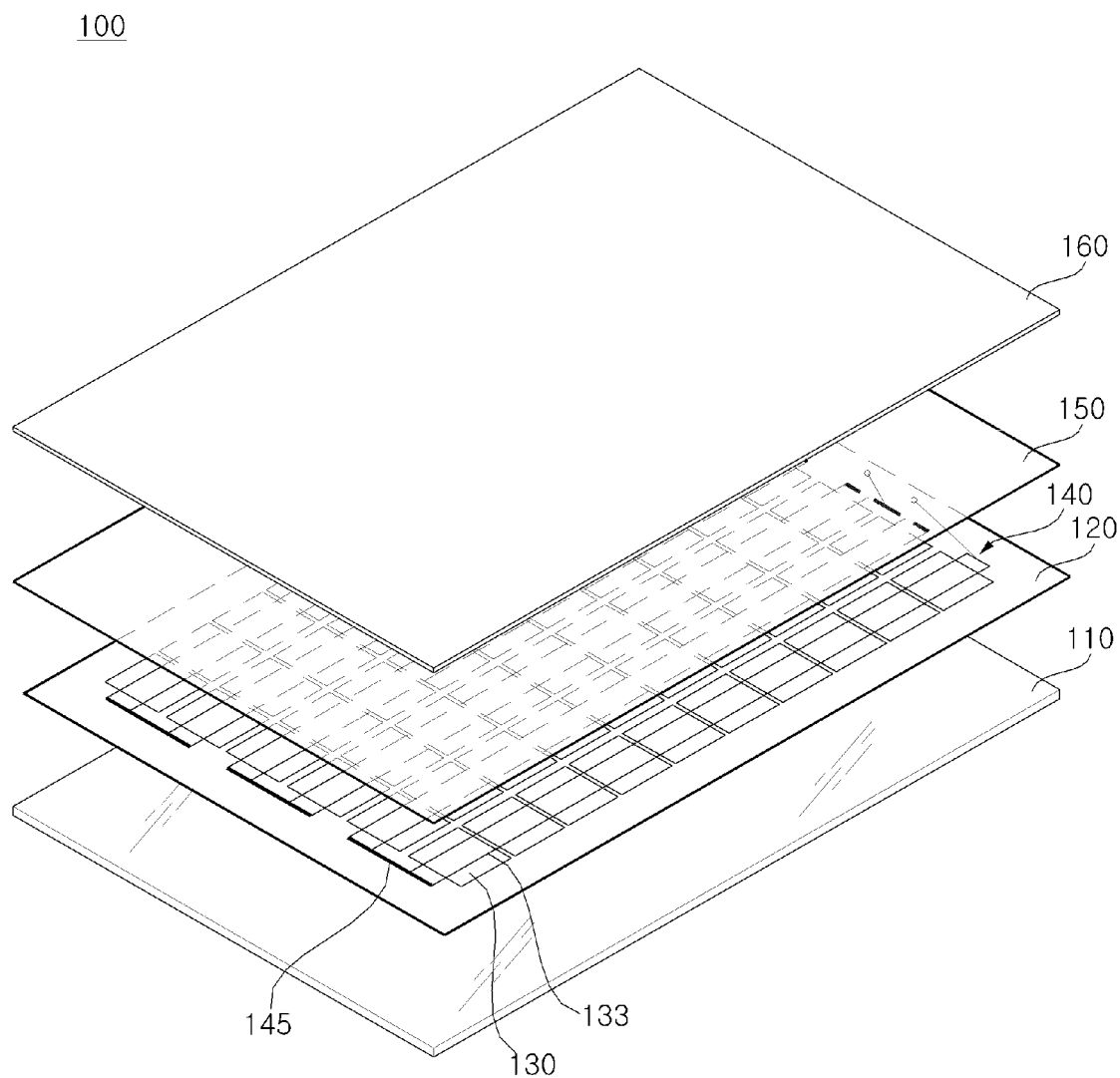
FIG. 8 is an exploded perspective view of the solar cell module illustrated in FIG. 6.

FIG. 8 is an exploded perspective view of the solar cell module illustrated in FIG. 6.

Referring to FIG. 8, the solar cell module 100 illustrated in FIG. 6 may include a plurality of solar cells 130. The solar cell module 100 may further include a first sealing member 120 and a second sealing member 150, which are respectively disposed on the lower surface and the upper surface of the solar cells 130, a back substrate 110 disposed on a lower surface of the first sealing member 120, and a front substrate 160 disposed on the upper surface of the second sealing member 150.

The solar cells 130 are semiconductor devices which convert sunlight into electrical energy and may be silicon solar cells, compound semiconductor solar cells, tandem solar cells, dye sensitized solar cells, CdTe type solar cells, or CIGS type solar cells.

Each of the solar cells 130 includes a light-receiving surface on which sunlight is incident and a back surface opposite to the light-receiving surface. For example, each of the solar cells 130 may include a silicon substrate of a first conductive type, a semiconductor layer of a second conductive type formed on the silicon substrate, the second conductive type being opposite to the first conductive type, an anti-reflective layer formed on the semiconductor layer of the second conductive type and having at least one opening for exposing a surface portion of the semiconductor layer of the second conductive, a front electrode formed in contact with the surface portion of the semiconductor layer of the second conductive exposed through the opening, and a back electrode formed on the back surface of the silicon substrate.

The solar cells 130 may be electrically connected to each other in series, in parallel, or in series and in parallel. More specifically, the solar cells 130 may be electrically connected to each other by a ribbon (133 of FIG. 8). The ribbon 133 may be bonded to the front electrode formed on the light-receiving surface of one solar cells 130 and the back electrode formed on the back surface of another adjacent solar cell 130.

In FIG. 8, the ribbon 133 is formed in two rows. The solar cells 133 are connected in a line by the ribbon 133 to form a solar cell string 140.

Thus, as illustrated in FIG. 6, 6 strings 140a, 140b, 140c, 140d, 140e, and 140f are formed and each string may include 10 solar cells.

The back substrate 110 may be a back sheet having waterproof, insulation, and ultraviolet blocking functions and may be, without being limited to, a Tedlar/PET/Tedlar (TPT) type. While the back substrate 110 is illustrated as having a rectangular shape in FIG. 8, the back substrate 110 may be fabricated in various other shapes such as circular and semicircular shapes, according to an environment in which the solar cell module 100 is installed.

Meanwhile, the first sealing member 120 having the same size as the back substrate 110 may be attached to the back substrate 110 and the solar cells 130 may be adjacently disposed so as to form several columns on the first sealing member 120.

The second sealing member 150 may be disposed over the solar cells 130 and may be bonded to the first sealing member 120 via lamination.

In this case, the first sealing member 120 and the second sealing member 150 enable respective elements of the solar cells 130 to be chemically bonded. The first sealing member 120 and the second sealing member 150 may be formed of various materials such as ethylene vinyl acetate (EVA) films.

Meanwhile, the front substrate 160 may be disposed on the second sealing member 150 so as to transmit sunlight therethrough. The front substrate 160 may be formed of tempered glass in order to protect the solar cells 130 from external shock, etc. In addition, in order to prevent reflection of sunlight and raise transmittance of sunlight, the front substrate 160 may be formed of low-iron tempered glass.

Figure 9:
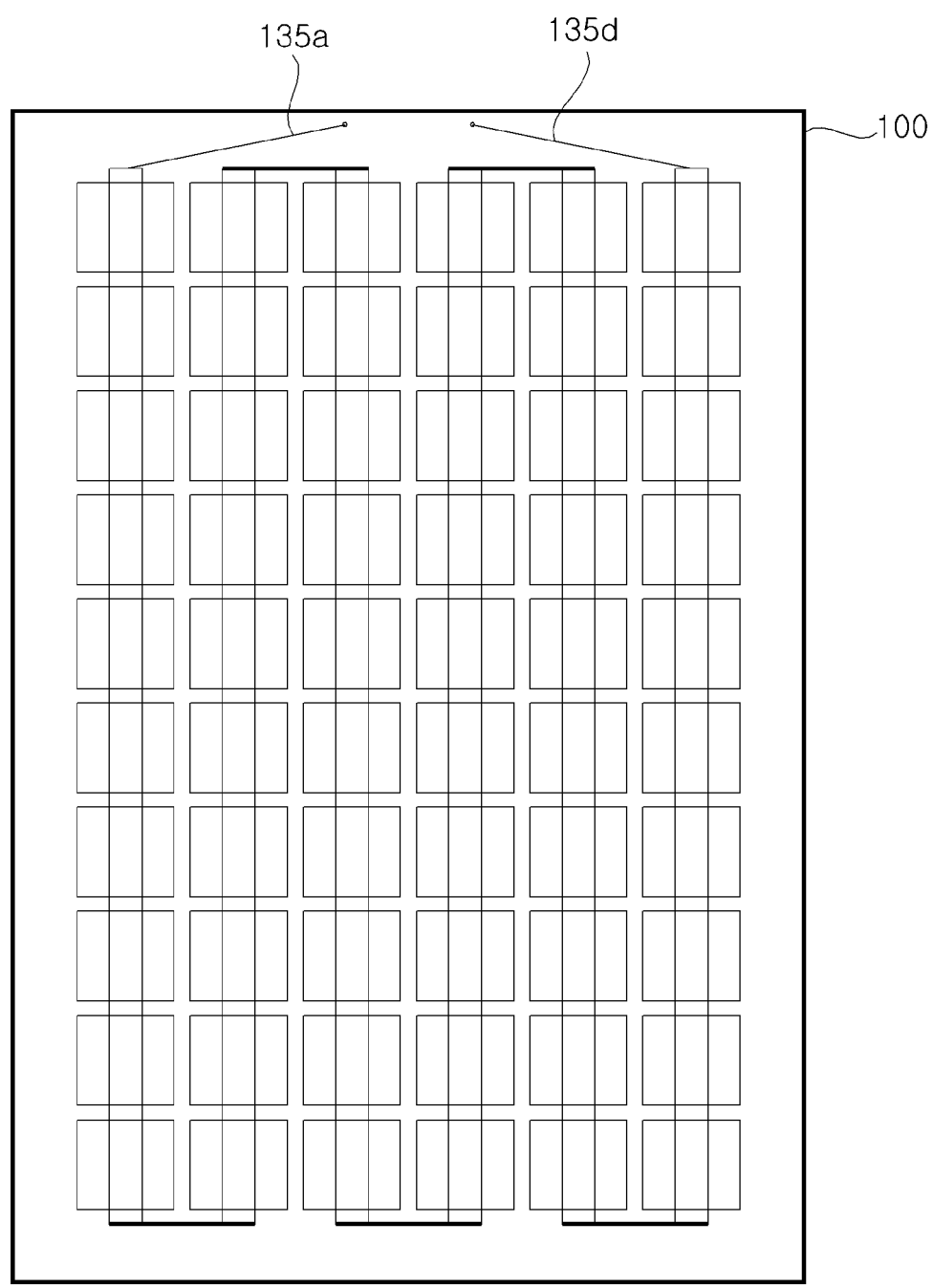
FIG. 9 is a view illustrating the case in which a shaded region is not present in the solar cell module illustrated in FIG. 6.

FIG. 9 is a view illustrating the case in which a shaded region is not present in the solar cell module illustrated in FIG. 6.

Referring to FIG. 9, the first conductive line 135a is connected to the upper end of the first solar cell string 140a and the second conductive line 135d is connected to the upper end of the sixth solar cell string 140f among the 6 solar cell strings 140a, 140b, 140c, 140d, 140e, and 140f.

If a normal solar cell which is not shaded generates a voltage of approximately 6.7V, 60 solar cells may generate a DC voltage of approximately 400V (=6.7V*60). Herein, a current flowing into each solar cell may be approximately 9 A.

Figure 10:
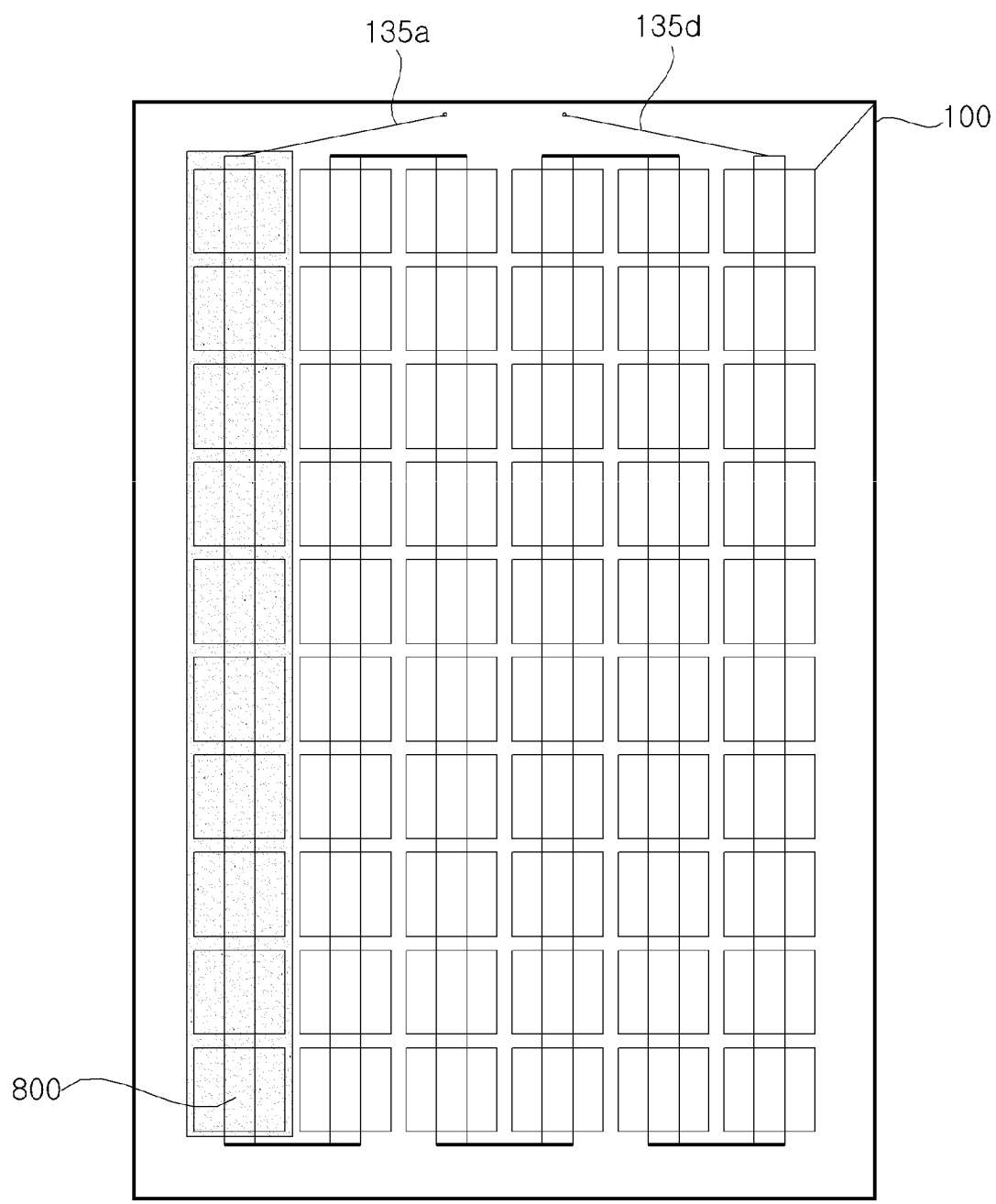
FIG. 10 is a view illustrating the case in which a shaded region occurs in the solar cell module illustrated in FIG. 6.

FIG. 10 is a view illustrating the case in which a shaded region occurs in the solar cell module illustrated in FIG. 6

FIG. 10 shows that a shaded region 800 occurs in the first solar cell string 140a among the 6 solar cell strings 140a, 140b, 140c, 140d, 140e, and 140f in the solar cell module 100.

If the shaded region 800 occurs, each solar cell in the first solar cell string 140a cannot supply a DC voltage of approximately 6.7V described above. For example, each solar cell in the first solar cell string 140a may output a reverse voltage of approximately −150V.

In addition, if the shaded region 800 occurs, a current flowing into each solar cell in the first solar cell string 140a is lowered to approximately 3 A and a current of 3 A, rather than a current of 9 A described with reference to FIG. 9, flows into the whole solar cell module 100.

That is, a current of 6 A corresponding to a difference between a current of 9 A and a current of 3 A flows around a solar cell in which shaded region 800 occurs. Thereby a hot spot may be generated.

Meanwhile, as illustrated in FIG. 2A, in the photovoltaic module 50 that does not include a bypass diode unit and a converter unit, there is an increasing probability of generating a hot spot caused by occurrence of a shaded region.

To solve the above problem, if a part of the plural solar cells is shaded, the photovoltaic module 50 of the present invention supplies a second current Impp2 having a level lower than a first current Impp1 which has been supplied prior to occurrence of a shaded region. Then, a probability of generating a hot spot is reduced during occurrence of the shaded region even though the bypass diode unit is not present.

This will now be described in detail with reference to FIG. 11.

Figure 11:
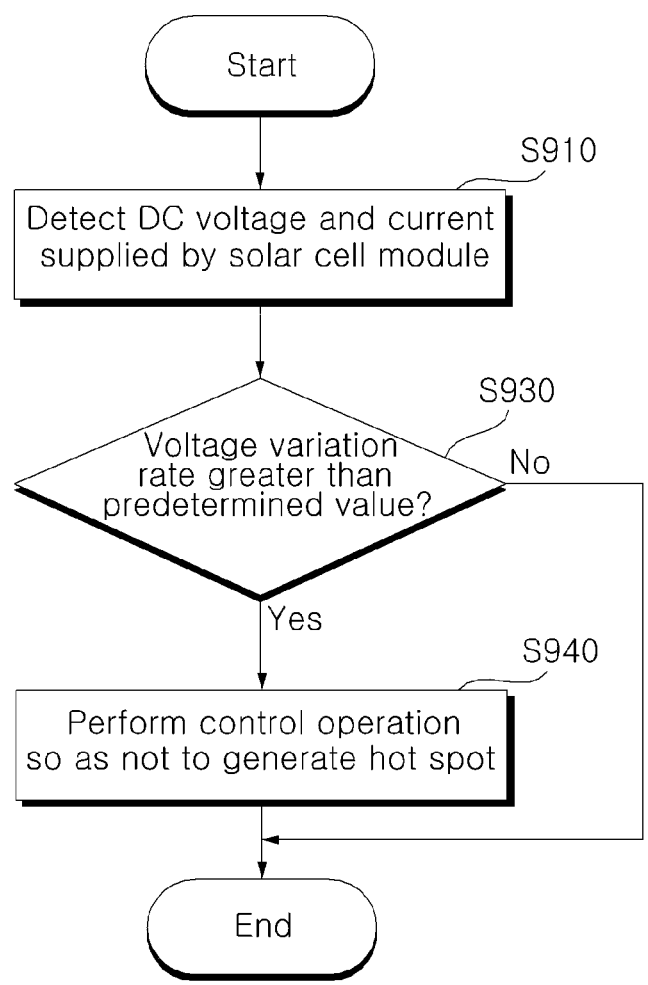
FIG. 11 is a flowchart illustrating an operation method of a photovoltaic module according to an embodiment of the present invention.
Figure 12A:
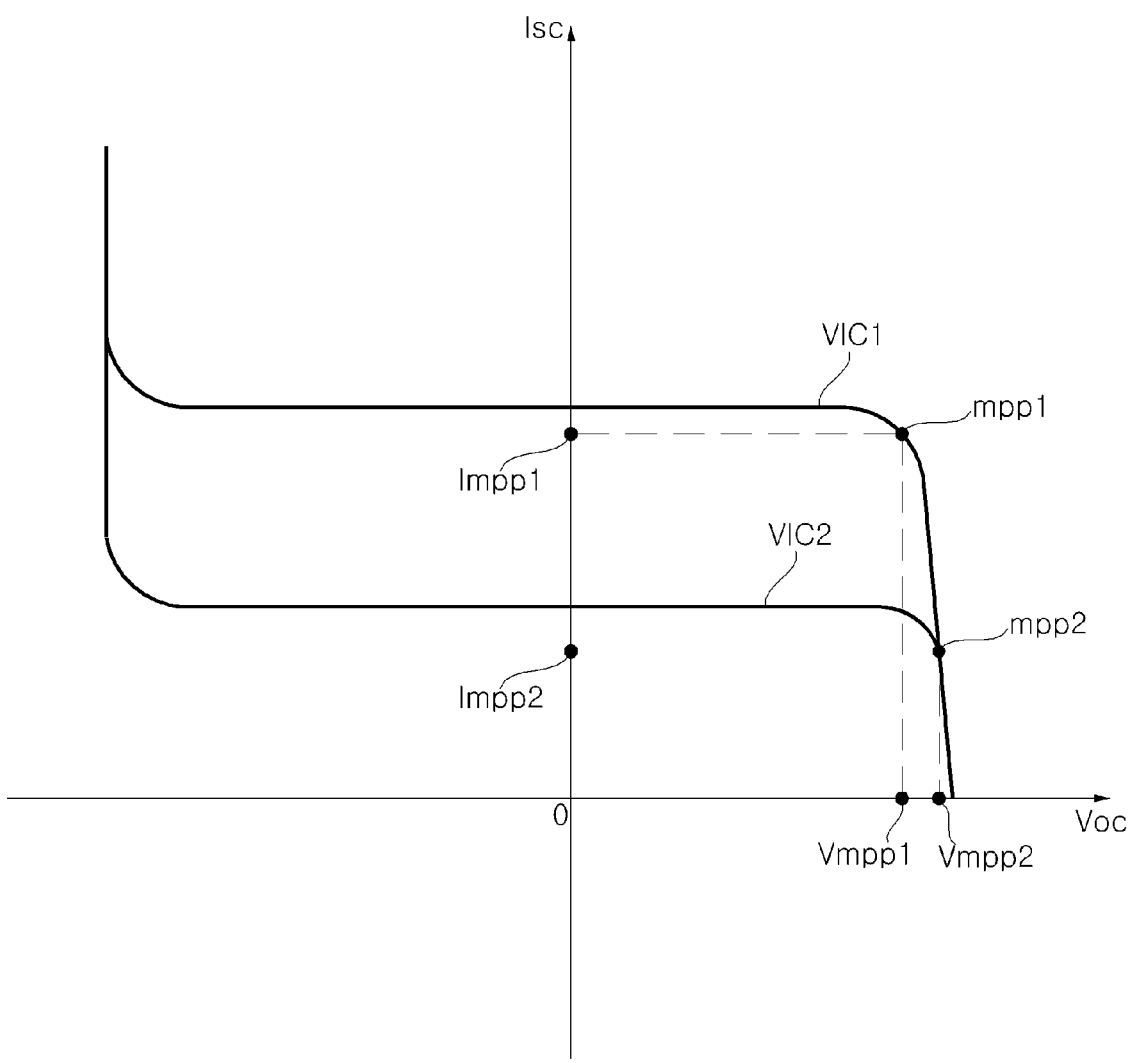
FIGS. 12A and 12B are views referred to for describing the operation method of FIG. 11.
Figure 12B:
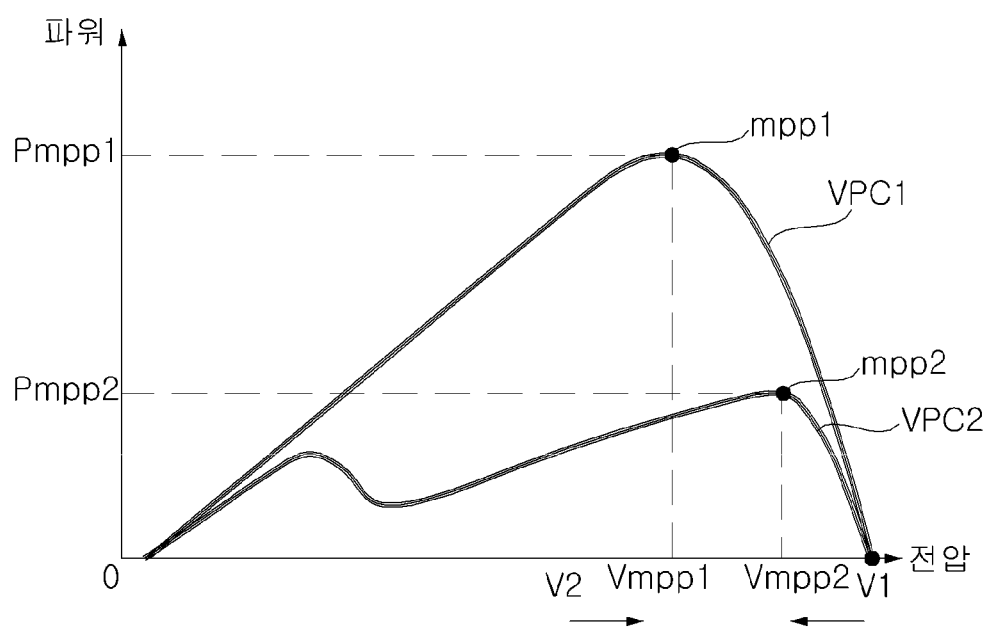

FIG. 11 is a flowchart illustrating an operation method of a photovoltaic module according to an embodiment of the present invention. FIGS. 12A and 12B are views referred to for describing the operation method of FIG. 11.

Referring to FIG. 11, the input current sensor A and the input voltage sensor B of the photovoltaic module 50 detect an input current Ic1 and an input voltage Vc1, respectively (S910).

The controller 550 may receive the input current Ic1 and the input voltage Vc1 detected respectively by the input current sensor A and the input voltage sensor B.

Next, the controller 550 determines whether a voltage variation rate of the input voltage Vc1 detected by the input voltage sensor B is greater than a predetermined value (S930). If so, the controller 550 performs a control operation so as not to generate a hot spot (S940).

The controller 550 may periodically check the voltage variation rate of the input voltage Vc1 detected by the input voltage sensor B.

If the shaded region 800 occurs as illustrated in FIG. 10, an input DC voltage supplied by the solar cell module may be changed from approximately 30V to approximately 25V.

Then, the controller may determine that the shaded region occurs in the solar cell module 100 because the voltage variation rate is greater than a predetermined value (e.g., 3V/sec or 3V/min).

Therefore, the controller 550 may perform a control operation such that the second current Impp2 having a level lower than the first current Impp1 which has been supplied prior to occurrence of the shaded region is supplied so as not to generate a hot spot caused by occurrence of the shaded region.

FIG. 12A illustrates a voltage-current curve VIC1 supplied to a solar cell module prior to occurrence of a shaded region and a voltage-current VIC2 supplied to the solar cell module after occurrence of the shaded region.

FIG. 12B illustrates a voltage-power curve VPC1 supplied to a solar cell module prior to occurrence of a shaded region and a voltage-power curve VPC2 supplied to the solar cell module after occurrence of the shaded region Referring to FIGS. 12A and 12B, the controller 550 calculates a power per voltage while reducing an open voltage Voc from a maximum voltage V1, by maximum power point tracking (MPPT), prior to occurrence of the shaded region, and determines whether the calculated power is a maximum power.

Since power increases in a duration from a voltage of V1 to a voltage of Vmpp1, the controller 550 updates and stores the calculated power. Since power decreases in a duration from the voltage of Vmpp1 to a voltage of V2, the controller 550 determines a power of Pmpp1 corresponding to the voltage of Vmpp1 to be a maximum power.

Then, the solar cell module 100 supplies the voltage of Vmpp1 and a current of Impp1 prior to occurrence of the shaded region. Herein, the voltage of Vmpp1 may be approximately 400V and the current of Impp1 may be approximately 9 A. That is, prior to occurrence of the shaded region, the solar cell module 100 may supply a power of approximately 3600 W.

Meanwhile, if the shaded region occurs, as illustrated in FIGS. 12A and 12B, the voltage-current curve VIC1 and the voltage-power curve VPC1 are changed to the voltage-current curve VIC2 and the voltage-power curve VPC2, respectively.

Then, the controller 550 calculates a power per voltage while reducing the open voltage Voc from the maximum voltage V1, by MPPT, according to occurrence of the shaded region, and determines whether the calculated power is a maximum power.

Since power increases in a duration from a voltage of V1 to a voltage of Vmpp2, the controller 550 updates and stores the calculated power. Since power decreases in a duration from the voltage of Vmpp2 to a voltage of V2, the controller 550 determines a power of Pmpp2 corresponding to the voltage of Vmpp2 to be a maximum power.

Herein, the voltage of Vmpp2 is higher in level than the voltage of Vmpp1, as illustrated in FIGS. 12A and 12B.

Then, the solar cell module 100 supplies the voltage of Vmpp2 and the current of Impp2 after occurrence of the shaded region. Herein, the voltage of Vmpp2 may be approximately 450V and the current of Impp2 may be approximately 3 A. That is, after occurrence of the shaded region, the solar cell module 100 may supply a power of approximately 1350 W.

Consequently, during occurrence of the shaded region, the solar cell module 100 supplies a voltage greater than a voltage prior to occurrence of the shaded region and supplies a current less than a current prior to occurrence of the shaded region.

In this way, since a current supplied by the solar cell module 100 in which the shaded region occurs is lowered, a hot spot in which temperature is raised in the shaded region 800 of FIG. 10 is not generated. Therefore, even when the shaded region occurs and there is no bypass diode, the solar cell module 100 can be stably operated.

FIG. 13 is a view illustrating an exemplary solar cell in the photovoltaic module of FIG. 2A.

Referring to FIG. 13, a first solar cell 1310 may output a first DC voltage Vce1 of approximately 0.6V.

If the first solar cell 1310 is cut once, a second solar cell 1320 corresponding to half the size of the first solar cell 1310 is generated. The second solar cell 1320 may output a second DC voltage Vce2 of approximately 0.6V.

Meanwhile, a voltage output from two second solar cells 1320 may be approximately 1.2V as 2*Vce2. Thus, if a solar cell is cut, a DC voltage output from a solar cell having the size of the first solar cell 1310 increases.

If the second solar cell 1320 is cut again, a third solar cell 1330 corresponding to half the size of the second solar cell 1320 is generated. That is, the third solar cell 1330 may be obtained by cutting the first solar cell 1310 twice.

The third solar cell 1320 may output a third DC voltage Vce3. The third DC voltage Vce3 may be approximately 0.6V.

A voltage output from 4 third solar cells 1330 may be approximately 2.4V corresponding to 4*Vce3. In this way, as the number of times of cutting a solar cell increases, a DC voltage output from a solar cell having the same size as the first solar cell 1310 increases.

If a solar cell having the same size as the solar cell 1300 outputs a voltage of approximately 6.7V as described with reference to FIG. 2A, a voltage of approximately 400V or more is output by the solar cell module 100 of FIG. 2A in consideration of 60 solar cells, using the above-described characteristic.

Therefore, the inverter unit 540 may convert a DC voltage into an AC voltage without boosting of a converter unit as described above.

FIGS. 14A to 14D are views illustrating various solar cell modules having the solar cell of FIG. 13.

Figure 14A:
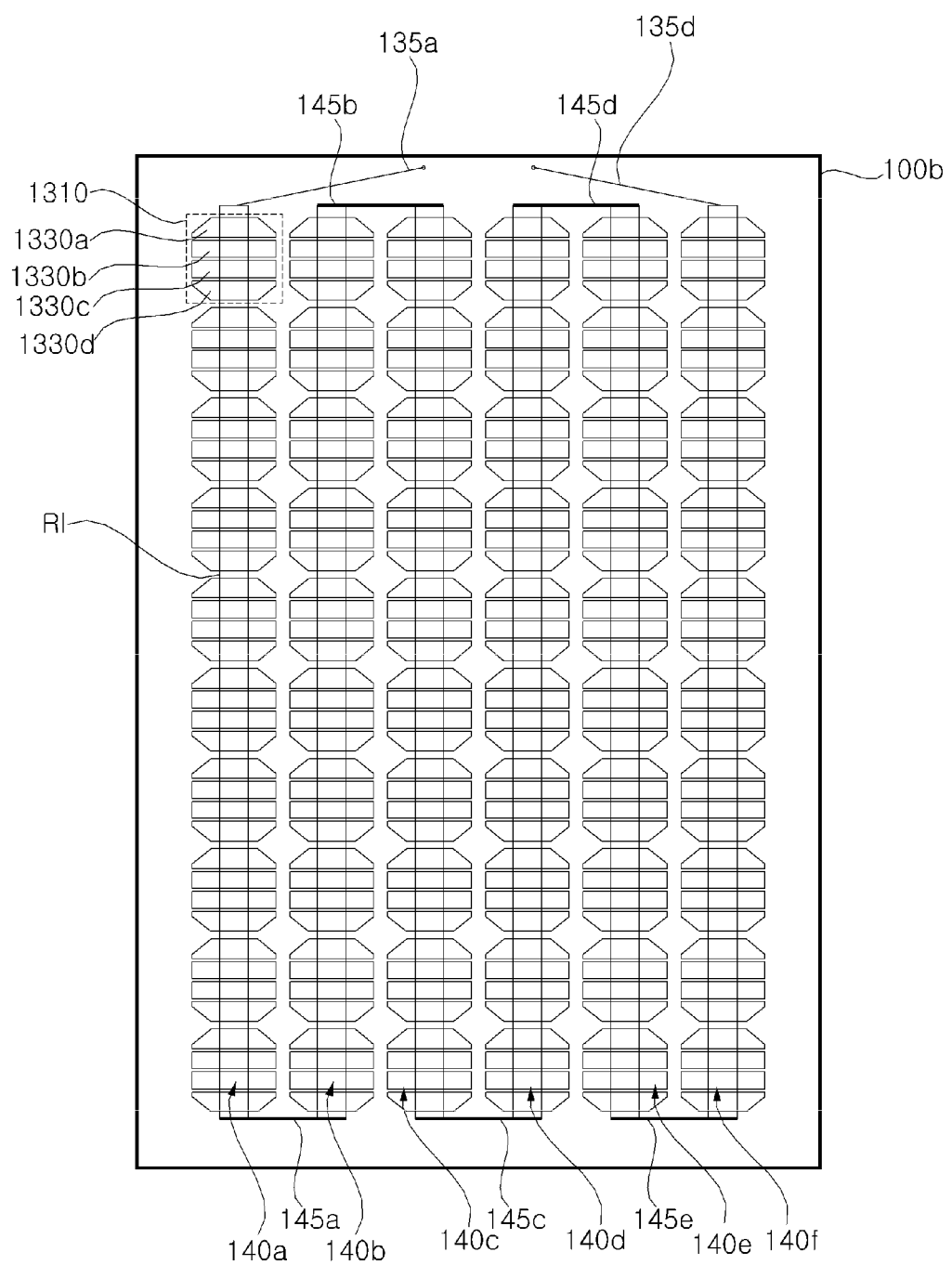
FIGS. 14A to 14D are views illustrating various solar cell modules having the solar cell of FIG. 13.

First, a solar cell module 100b of FIG. 14A includes solar cells each including 4 third solar cells 1330a to 1330d obtained by cutting the first solar cell 1310 of FIG. 13 four times.

The 4 third solar cells 1330a to 1330d may be separately disposed as illustrated. Then, the solar cell module 100a may output a DC voltage of a level higher than a peak value of a grid voltage.

In FIG. 14A, 60 solar cells 1330 are electrically connected by ribbons RI to form a total of 6 strings 140a, 140b, 140c, 140d, 140e, and 140f formed on a front surface of the solar cell module 100a.

To allow all solar cells to be serially connected, a bus ribbon may be connected between a string and a string.

In the drawing, a first ribbon 145a connected between a first string 140a and a second string 140b, a third bus ribbon 145c connected between a third string 140c and a fourth string 140d, and a fifth bus ribbon 145e connected between a fifth string 140e and a sixth string 140f are disposed on the lower end of the solar cell module 100a.

In addition, a second bus ribbon 145b connected between the second string 140b and the third string 140c and a fourth bus ribbon 145c connected between the fourth string 140d and the fifth string 140e are disposed on the upper end of the solar cell module 100a.

A first conductive line 135a and a second conductive line 135d are respectively connected to the upper end of the first string 141 and the upper end of the sixth string, which are ends of the solar cell strings to which the bus ribbons 145a to 145f are not connected. The first conductive line 135a and the second conductive line 135d are extended to the back surface of the solar cell module 100a through an opening formed on the solar cell module 100a and are connected to a circuit element (capacitor unit 520 or the bypass diode unit 510) in the junction box 200 disposed on the back surface of the solar cell module.

Meanwhile, as opposed to the drawing, the first solar cell 1310 of FIG. 13 may be cut 12 times to provide 12 third solar cells 1330a to 1330l. In consideration of 60 solar cells, the solar cell module 100a may output a voltage of approximately 400V or more.

Therefore, the solar cell module 100a may output a DC voltage having a level higher than the peak value of the grid voltage.

If an RMS voltage level of the grid 90 illustrated in FIG. 2A is approximately 220V, the peak value of the grid 90 may be approximately 156V or more. In this case, the solar cell module 100*a* may output a voltage of approximately 200V or more.

Therefore, it is desirable that the first solar cell 1310 of FIG. 13 be cut 6 times to provide 6 third solar cells 1330*a* to 1330*f* (not shown). In consideration of 60 solar cells, a voltage of approximately 200V or more may be output by the solar cell module 100*a*.

Figure 14B:
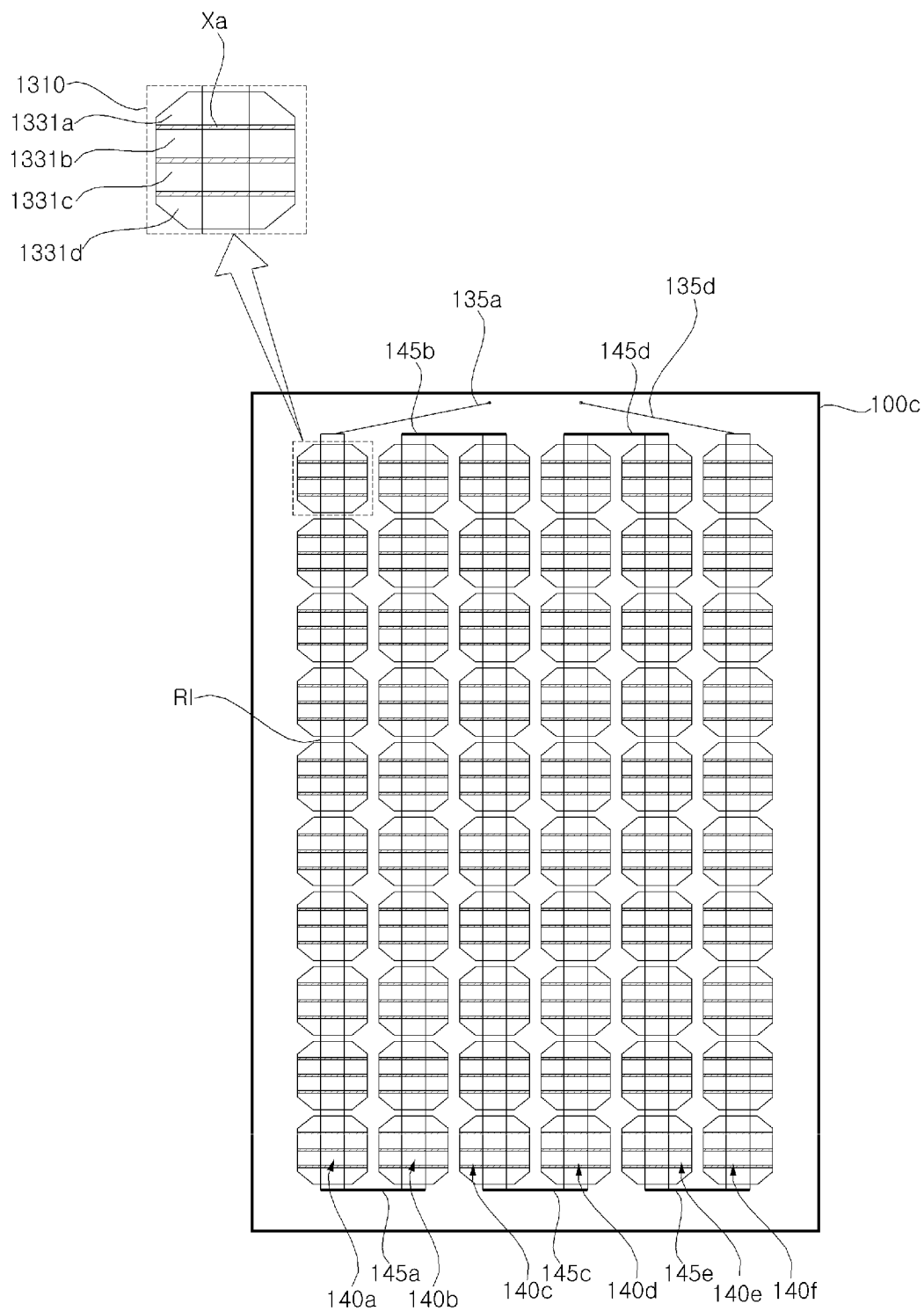

Next, a solar cell module 100*c* of FIG. 14B includes 4 third solar cells 1331*a* to 1331*d* obtained by cutting the first solar cell 1310 of FIG. 13 four times.

As opposed to FIG. 14A, the 4 third solar cells 1331*a* to 1331*d* in the solar cell module 100*b* may overlap as illustrated. An overlapping area Xa is illustrated in FIG. 14B.

Particularly, since a light irradiation area is wider due to the overlapping area Xa, the solar cell module 100*b* may output a DC voltage having a level higher than the solar cell module 100*a* of FIG. 14A.

Figure 14C:
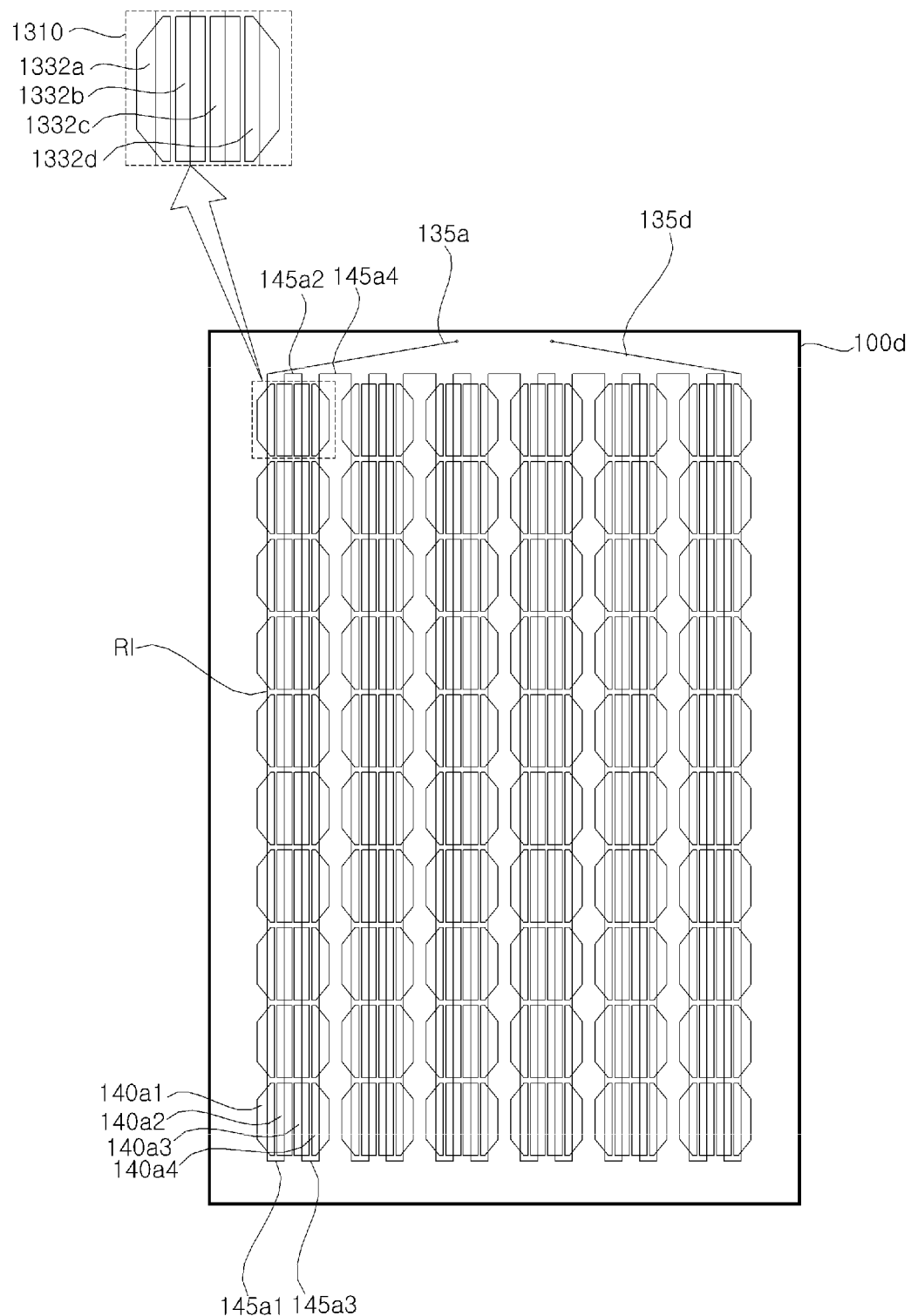

FIG. 14C illustrates a solar cell module 100*d* including 4 third solar cells 1332*a* to 1332*d* obtained by cutting the first solar cell 1310 of FIG. 13 four times.

FIG. 14C is different from FIGS. 14A and 14B in that the first solar cell is cut in a vertical direction corresponding to a direction in which a ribbon RI is extended, rather than in a horizontal direction crossing the vertical direction in which the ribbon RI is extended.

In FIG. 14C, 60 solar cells are electrically connected by ribbons RI and a total of 24 (=4*6) strings is formed on the front surface of the solar cell module 100*d*.

For convenience, in FIG. 14B, reference numerals are added only to first to fourth strings 140*a*1, 140*a*2, 140*a*3, and 140*a*4 among 24 strings.

To allow all solar cells are to be connected in series, a bus ribbon may be connected between a string and a string.

In FIG. 14B, a first bus ribbon 145*a*1 connected between a first string 140*a*1 and a second string 140*a*2 and a third bus ribbon 145*a*3 connected between a third string 140*a*3 and a fourth string 140*a*4 are disposed on the lower end of the solar cell module 100*d*.

In addition, a second bus ribbon 145*a*2 connected between the second string 140*a*2 and the third string 140*a*3 and a fourth bus ribbon 145*a*4 connected between the fourth string 140*a*4 and a fifth string 140*b*1 are disposed on the upper end of the solar cell module 100*d*.

A first conductive line 135*a* and a second conductive line 135*d* are respectively connected to the upper end of the first string 141*a*1 and the upper end of the fourth string 140*f*4, which are ends of the solar cell strings to which the bus ribbons are not connected. The first conductive line 135*a* and the second conductive line 135*d* are extended to the back surface of the solar cell module 100*d* through an opening formed on the solar cell module 100*d* and are connected to a circuit element (capacitor unit 520 or the bypass diode unit 510) in the junction box 200 disposed on the back surface of the solar cell module.

Meanwhile, as opposed to FIG. 14C, the first solar cell 1310 of FIG. 13 may be cut 12 times to provide 12 third solar cells 1332*a* to 1332*l*. In consideration of 60 solar cells, the solar cell module 100*a* may output a voltage of approximately 400V or more.

Therefore, the solar cell module 100*d* may output a DC voltage having a level higher than the peak value of the grid voltage.

Figure 14D:
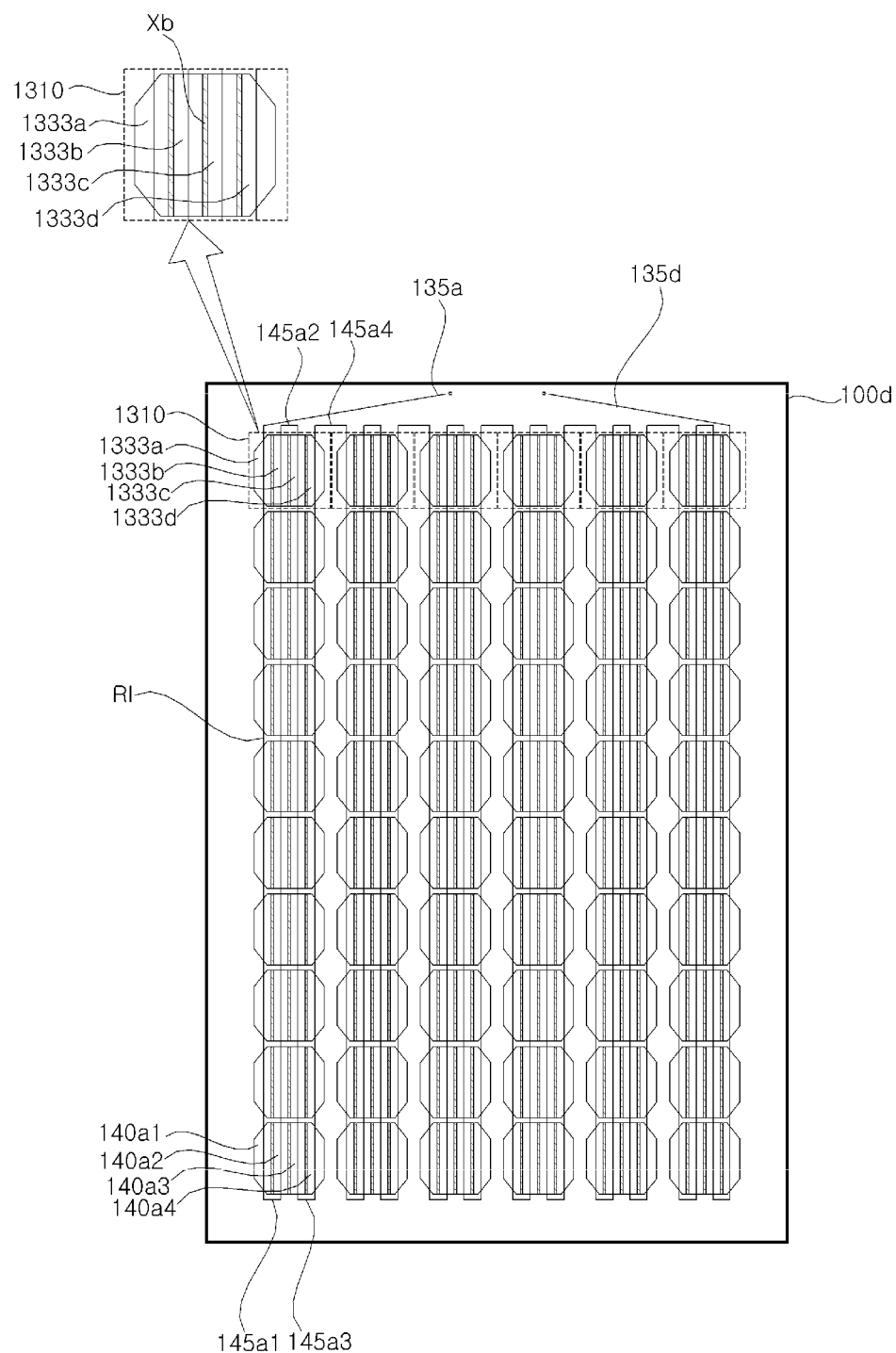

Next, a solar cell module 100*e* of FIG. 14D includes 4 third solar cells 1333*a* to 1333*d* obtained by cutting the first solar cell 1310 of FIG. 13 four times.

As opposed to FIG. 14C, the solar cells 1333*a* to 1333*d* in the solar cell module 100*e* may overlap as illustrated in FIG. 14D. An overlapping area Xa is illustrated in FIG. 14D.

Particularly, since a light irradiation area is wider due to the overlapping area Xa, the solar cell module 100*e* may output a DC voltage having a level higher than the solar cell module 100*d* of FIG. 14C.

The photovoltaic module according to embodiments of the present invention should not be limited to configurations and methods of the above-described embodiments and all or some of the embodiments may be selectively combined with one another to achieve various alterations.

A photovoltaic module in accordance with an embodiment of the present invention includes a solar cell module including a plurality of solar cells, and an inverter unit to receive a direct current (DC) voltage from the solar cell module and convert the DC voltage received from the solar cell module into an alternating current (AC) voltage without converting a level of the DC voltage received from the solar cell module. Thereby, the AC voltage can be output without converting the level of the DC voltage received from the solar cell module.

Then, since the AC voltage can be output without voltage boosting, the photovoltaic module having high efficiency can be provided by reducing loss generated during voltage conversion.

Particularly, circuit implementation is simplified by omitting a converter for converting the level of the DC voltage, i.e., a DC/DC converter.

In addition, power conversion loss and heat generation can be considerably reduced by omitting a transformer etc. included in the converter.

Meanwhile, when the level of the DC voltage output from the solar cell module is greater than a peak value of a grid voltage, since the inverter outputs the AC voltage, the AC voltage can be stably output.

In addition, an AC voltage corresponding to the grid frequency can be output by switching a switching element in the inverter by a switching frequency greater than a grid frequency.

Meanwhile, a bypass diode unit may not be provided in the photovoltaic module. If a part of a plurality of solar cells is shaded, a second current having a level lower than a first current which has been supplied prior to occurrence of the shaded region is supplied. Therefore, a probability of generating hot spots during occurrence of the shaded region can be reduced even through there is no bypass diode.

A photovoltaic module in accordance with another embodiment of the present invention includes a solar cell module including a plurality of solar cells, an inverter unit to receive a direct current (DC) voltage output from the solar cell module and convert the DC voltage received from the solar cell module into an alternating current (AC) voltage without changing a level of the DC voltage received from the solar cell module, the inverter unit including a plurality of switching elements, and a controller to control the inverter unit, wherein the controller performs a control operation such that switching frequencies of the switching elements in the inverter unit are higher than a frequency of a grid. Thereby the AC voltage can be output without converting the level of the DC voltage received from the solar cell module.

Then, since the AC voltage can be output without boosting a voltage, the photovoltaic module having high efficiency can be provided by reducing loss generated during voltage conversion.

While the present invention has been particularly shown and described with reference to exemplary embodiments thereof, it will be understood by those of ordinary skill in the art that various changes in form and detail may be made herein without departing from the spirit and scope of the present invention as defined by the following claims and such modifications and variations should not be understood individually from the technical idea or aspect of the present invention.

What is claimed is:

1. A photovoltaic module, comprising:
   a solar cell module including a plurality of solar cells;
   a capacitor unit to receive a direct current (DC) voltage from the solar cell module and to store the DC voltage output from the solar cell module;
   an inverter unit to convert the DC voltage stored in the capacitor unit into an alternating current (AC) voltage without converting a level of the DC voltage received from the solar cell module;
   a controller to control the inverter unit;
   an input current detector to detect an input current flowing into the capacitor unit; and
   an input voltage detector to detect an input voltage of both terminals of the capacitor unit,
   wherein the solar cell module outputs the DC voltage having a level higher than a peak value of a grid voltage,
   wherein the controller calculates a maximum power for the solar cell module and controls the inverter unit to output the AC voltage using a DC voltage corresponding to the maximum power, and
   wherein the plurality of solar cells include multi-cutting cells, respectively.

2. The photovoltaic module according to claim 1, wherein the controller controls the inverter unit to output the AC voltage when the level of the DC voltage received from the solar cell module is greater than a peak value of a grid voltage.

3. The photovoltaic module according to claim 1, wherein the inverter unit includes:
   a first upper arm switching element and a first lower arm switching element connected in series; and
   a second upper arm switching element and a second lower arm switching element connected in series, the second upper arm switching element and the second lower arm switching element being connected in parallel to the first upper arm switching element and the second lower arm switching element, and
   wherein a switching frequency of the first and second upper arm switching elements and a switching frequency of the first and second lower arm switching elements are greater than a frequency of a grid.

4. The photovoltaic module according to claim 1, wherein the solar cell module further includes a first conductive line connected to a first solar cell among the plurality of solar cells and a second conductive line connected to a second solar cell among the plurality of solar cells, and
   the first conductive line and the second conductive line are connected to an inverter unit disposed on a back surface of the solar cell module.

5. The photovoltaic module according to claim 1, further comprising:
   a junction box disposed on a back surface of the solar cell module and to include the capacitor unit and the inverter unit.

6. The photovoltaic module according to claim 1, wherein the solar cell module further includes a first conductive line connected to a first solar cell among the plurality of solar cells and a second conductive line connected to a second solar cell among the plurality of solar cells, and
   wherein the first conductive line and the second conductive line are connected to the capacitor unit disposed on a back surface of the solar cell module.

7. The photovoltaic module according to claim 6, wherein, when a part of the plurality of solar cells is shaded, the controller controls the inverter unit to supply the second current having a level lower than the first current which has been supplied prior to occurrence of a shaded region, without bypassing at least one of the first conductive line and the second conductive line.

8. The photovoltaic module according to claim 7,
   wherein the controller determines whether a part of the plurality of solar cells is shaded, based on the input current detected by the input current detector or the input voltage detected by the input voltage detector and, when the shaded region occurs, controls the inverter unit to supply a second current having a level lower than the first current which has been supplied prior to occurrence of the shaded region.

9. The photovoltaic module according to claim 7, further comprising
   an input voltage detector to detect an input voltage of both terminals of the capacitor unit,
   wherein the controller controls the inverter unit to supply the second current having a level lower than the first current when a voltage variation rate of the input voltage detected by the input voltage detector is greater than a predetermined value.

10. The photovoltaic module according to claim 6, further comprising:
    a bypass diode unit to bypass the DC voltage output from the solar cell module,
    wherein the capacitor unit stores a DC voltage from the bypass diode unit.

11. The photovoltaic module according to claim 10, wherein the solar cell module further includes a first conductive line connected to a first solar cell among the plurality of solar cells and a second conductive line connected to a second solar cell among the plurality of solar cells, and
    wherein the first conductive line and the second conductive line are connected to the bypass diode unit disposed on a back surface of the solar cell module.

12. The photovoltaic module according to claim 10, further comprising:
    a junction box disposed on the back surface of the solar cell module and to include the bypass diode unit, the capacitor unit, and the inverter unit.

13. The photovoltaic module according to claim 10, further comprising:
    a junction box disposed on the back surface of the solar cell module and to include the capacitor unit and the inverter unit; and
    a second junction box disposed on the back surface of the solar cell module, separated from the junction box, and to include the bypass diode unit.

14. A photovoltaic module, comprising:
    a solar cell module including a plurality of solar cells;
    an inverter unit to receive a direct current (DC) voltage from the solar cell module and convert the DC voltage received from the solar cell module into an alternating current (AC) voltage without converting a level of the DC voltage received from the solar cell module; and
    a capacitor unit to store the DC voltage output from the solar cell module, wherein the inverter unit converts the DC voltage stored in the capacitor unit into the AC voltage, wherein the solar cell module further includes a first conductive line connected to a first solar cell among the plurality of solar cells and a second conductive line connected to a second solar cell among the plurality of solar cells, wherein the first conductive line and the second conductive line are connected to the capacitor unit disposed on a back surface of the solar cell module, wherein the photovoltaic module further includes a controller to control the inverter unit, wherein, when a part of the plurality of solar cells is shaded, the controller controls the inverter unit to supply a second current having a level lower than a first current which has been supplied prior to occurrence of a shaded region, without bypassing at least one of the first conductive line and the second conductive line, wherein the photovoltaic module further includes an input current detector to detect an input current flowing into the capacitor unit, wherein the photovoltaic module further includes an input voltage detector to detect an input voltage of both terminals of the capacitor unit, and wherein the controller determines whether a part of the plurality of solar cells is shaded, based on the input current detected by the input current detector or the input voltage detected by the input voltage detector and, when the shaded region occurs, controls the inverter unit to supply a second current having a level lower than the first current which has been supplied prior to occurrence of the shaded region.

* * * * *